United States Patent
Song et al.

(10) Patent No.: US 11,430,858 B2
(45) Date of Patent: Aug. 30, 2022

(54) DISPLAY PANEL HAVING POWER BUS LINE WITH REDUCED VOLTAGE DROP

(71) Applicant: SAMSUNG DISPLAY CO., LTD., Yongin-si (KR)

(72) Inventors: Hwayoung Song, Yongin-si (KR); Jihyun Ka, Yongin-si (KR); Kimyeong Eom, Yongin-si (KR); Kwangsae Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 830 days.

(21) Appl. No.: 16/294,306

(22) Filed: Mar. 6, 2019

(65) Prior Publication Data
US 2020/0058728 A1      Feb. 20, 2020

(30) Foreign Application Priority Data
Aug. 17, 2018   (KR) .................... 10-2018-0096131

(51) Int. Cl.
*H01L 27/32*          (2006.01)
(52) U.S. Cl.
CPC ...... *H01L 27/3279* (2013.01); *H01L 27/3265* (2013.01)
(58) Field of Classification Search
CPC .................. H01L 27/3279; H01L 27/3265
USPC ......................................................... 257/40
See application file for complete search history.

(56) References Cited

U.S. PATENT DOCUMENTS

| | | | |
|---|---|---|---|
| 8,754,859 B2 | 6/2014 | Gates et al. | |
| 8,994,709 B2 | 3/2015 | Han | |
| 9,685,131 B2 | 6/2017 | Tanaka et al. | |
| 9,734,755 B2 | 8/2017 | Lee et al. | |
| 9,959,812 B2 | 5/2018 | Hwang et al. | |
| 2007/0103063 A1* | 5/2007 | Kim | H01L 27/3244 313/504 |
| 2010/0007825 A1* | 1/2010 | Kwon | G02F 1/134309 349/114 |

(Continued)

FOREIGN PATENT DOCUMENTS

JP         6230074 B2      10/2017
KR     10-1082300 B1      11/2011
(Continued)

*Primary Examiner* — Phuc T Dang
*Assistant Examiner* — Charles N Ausar-El
(74) *Attorney, Agent, or Firm* — Kile Park Reed & Houtteman PLLC

(57) ABSTRACT

A display panel includes a substrate including a first non-display area surrounding a transmission area, a display area on an outer portion of the first non-display area, and a second non-display area surrounding the display area, driving thin film transistors and display elements in the display area, a first power supply line in the second non-display area and extending in a first direction, first driving voltage lines and second driving voltage lines extending in a second direction intersecting with the first direction and spaced apart from each other with the transmission area therebetween, and a power bus line connected to the second driving voltage lines in the first non-display area or second non-display area, the power bus line extending in the first direction. A length of the power bus line in the first direction is less than a length of the first power supply line in the first direction.

20 Claims, 14 Drawing Sheets

(56) References Cited

U.S. PATENT DOCUMENTS

2010/0328290 A1* 12/2010 Jeong .................... G02F 1/1362
                                                            438/30
2016/0351645 A1* 12/2016 You ....................... H01L 27/326
2018/0069069 A1*  3/2018 Ebisuno ................ H01L 27/326

FOREIGN PATENT DOCUMENTS

| KR | 10-1431927 B1      | 8/2014 |
| KR | 10-2016-0022969 A  | 3/2016 |
| KR | 10-2017-0042746 A  | 4/2017 |

* cited by examiner

DISPLAY PANEL HAVING POWER BUS LINE WITH REDUCED VOLTAGE DROP

CROSS-REFERENCE TO RELATED APPLICATION

Korean Patent Application No. 10-2018-0096131, filed on Aug. 17, 2018, in the Korean Intellectual Property Office, and entitled: "Display Panel," is incorporated by reference herein in its entirety.

BACKGROUND

1. Field

One or more embodiments relate to a display panel and a display apparatus including the display panel.

2. Description of the Related Art

Display apparatuses have been used for various purposes. Also, since the thickness and weight of the display apparatuses have been reduced, a utilization range of the display apparatuses has increased.

According to use of the display apparatuses, different methods of designing a shape thereof have been developed and more functions have been embedded in or linked to the display apparatuses.

SUMMARY

Embodiments are directed to a display panel including a substrate that includes a first non-display area surrounding a transmission area, a display area on an outer portion of the first non-display area, and a second non-display area surrounding the display area, driving thin film transistors and display elements in the display area, a first power supply line in the second non-display area, the first power supply line extending in a first direction, a plurality of first driving voltage lines and a plurality of second driving voltage lines extending in a second direction intersecting with the first direction and spaced apart from each other with the transmission area therebetween, and a power bus line connected to the plurality of second driving voltage lines in the first non-display area or the second non-display area, the power bus line extending in the first direction. A length of the power bus line in the first direction is less than a length of the first power supply line in the first direction.

The power bus line may be in the second non-display area and may be integrated with the plurality of second driving voltage lines.

The display panel may further include at least one third driving voltage line extending from the first power supply line in the second direction and connected to the power bus line. The at least one third driving voltage line, the first power supply line, and the power bus line may be integrated with one another.

The display panel may further include at least one fourth driving voltage line extending from the first power supply line in the second direction. An end of the at least one fourth driving voltage line may be spaced apart from the power bus line.

The display panel may further include a plurality of electrode voltage lines arranged at a different layer from the plurality of first driving voltage lines and the plurality of second driving voltage lines, the plurality of electrode voltage lines extending in the first direction, and intersecting the plurality of first driving voltage lines and the plurality of second driving voltage lines. The plurality of electrode voltage lines may be connected to the plurality of first driving voltage lines and the plurality of second driving voltage lines via a contact hole.

A specific resistance of the power bus line may be less than a specific resistance of the plurality of electrode voltage lines.

At least some of the plurality of electrode voltage lines are connected to one another in a ring shape around the transmission area.

Each of the driving thin film transistors may include a semiconductor layer and a driving gate electrode. The plurality of electrode voltage lines may overlap the driving gate electrode to form a storage capacitor.

A width of the transmission area in the first direction may be greater than a width of the transmission area in the second direction.

The power bus line may be in the first non-display area at a different layer from the plurality of second driving voltage lines and may be connected to the plurality of second driving voltage lines via a contact hole.

The display panel may further include a plurality of scan lines extending in the first direction and arched around a boundary of the transmission area. The power bus line may overlap arched parts in the plurality of scan lines.

The display panel may further include an additional power bus line connected to the plurality of first driving voltage lines and extending in the first direction. The additional power bus line may be arranged in the first non-display area.

The transmission area may include a plurality of transmission areas. The first non-display area may surround the plurality of transmission areas.

Embodiments are also directed to a display panel including a substrate including a first non-display area surrounding a transmission area, a display area on an outer portion of the first non-display area, and a second non-display area surrounding the display area, driving thin film transistors and display elements in the display area, a first power supply line in the second non-display area, the first power supply line extending in a first direction, a plurality of first driving voltage lines and a plurality of second driving voltage lines extending in a second direction intersecting the first direction and spaced apart from each other with the transmission area therebetween, a power bus line connected to the plurality of second driving voltage lines, the power bus line being in the first non-display area or the second non-display area to extend in the first direction, and a plurality of electrode voltage lines intersecting the plurality of first driving voltage lines and the plurality of second driving voltage lines at a different layer from the plurality of first driving voltage lines and the plurality of second driving voltage lines, the plurality of electrode voltage lines being connected to the plurality of first driving voltage lines and the plurality of second driving voltage lines via a contact hole.

A specific resistance of the power bus line may be less than a specific resistance of the plurality of electrode voltage lines.

At least some of the plurality of electrode voltage lines may be connected to one another in a ring shape around the transmission area.

Each of the driving thin film transistors may include a semiconductor layer and a driving gate electrode. The plurality of electrode voltage lines may overlap the driving gate electrode to form a storage capacitor.

The power bus line may be in the second non-display area and may be integrated with the plurality of second driving voltage lines.

The power bus line may be in the first non-display area and may be located at a different layer from the plurality of second driving voltage lines to be connected to the plurality of second driving voltage lines via a contact hole.

The display panel may further include an additional power bus line connected to the plurality of first driving voltage lines and extending in the first direction, wherein the additional power bus line is in the first non-display area.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
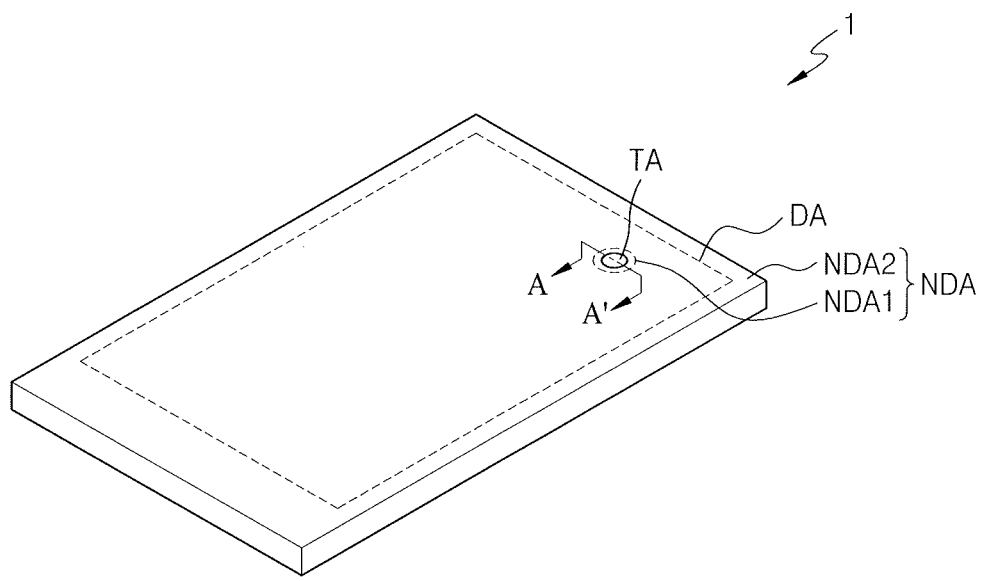
FIG. 1 illustrates a perspective view of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

FIG. 1 illustrates a perspective view of a display apparatus 1 according to an embodiment.

Referring to FIG. 1, the display apparatus 1 may include a display area DA emitting light and a non-display area NDA not emitting light. The display apparatus 1 may provide a predetermined image via light emitted from a plurality of pixels arranged in the display area DA.

The display apparatus 1 may also include a transmission area TA. The transmission area TA may be at least partially surrounded by the display area DA. As an example, referring to FIG. 1, the transmission area TA may be entirely surrounded by the display area DA. The non-display area NDA may include a first non-display area NDA1 surrounding the transmission area TA, and a second non-display area NDA2 surrounding an outer portion of the display area DA. For example, the first non-display area NDA1 may entirely surround the transmission area TA, the display area DA may entirely surround the first non-display area NDA1, and the second non-display area NDA2 may entirely surround the display area DA.

The transmission area TA may be an area where an electronic element is arranged, as it will described later with reference to FIG. 2A. The transmission area TA may be considered as an area through which light and/or sound output from an electronic element or proceeding towards the electronic element may pass from the outside. In an embodiment, when the light transmits through the transmission area TA, a light transmittance may be about 20% or greater, for example, 50% or greater, 75% or greater, 80% or greater, 85% or greater, or 90% or greater.

Hereinafter, according to an embodiment, it is considered that the display apparatus is an organic light-emitting display apparatus. In some implementations, the display apparatus 1 may be an inorganic light-emitting display, a quantum dot light-emitting display, etc.

In FIG. 1 it is illustrated that the transmission area TA is in a portion (upper right portion) of the display area DA of a rectangular shape. In some implementations, the display area DA may have a circular shape, an ellipse shape, or a polygonal shape such as a triangle, a pentagon, etc. A size, a shape, the number, and a location of the transmission area TA may be variously modified.

Figure 2A:
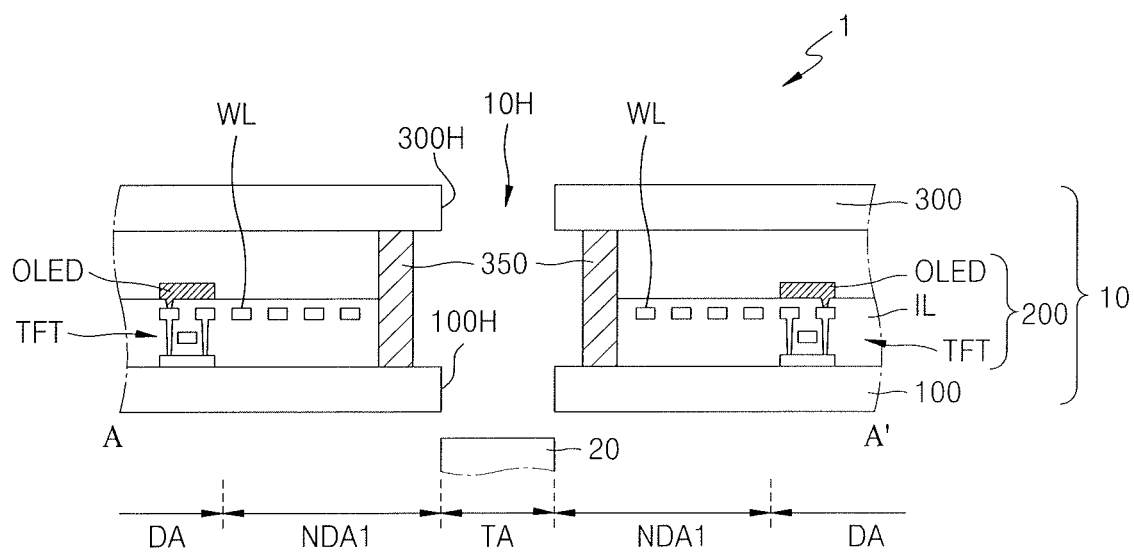
FIGS. 2A to 2C illustrate cross-sectional views of a display apparatus according to an embodiment.
Figure 2B:
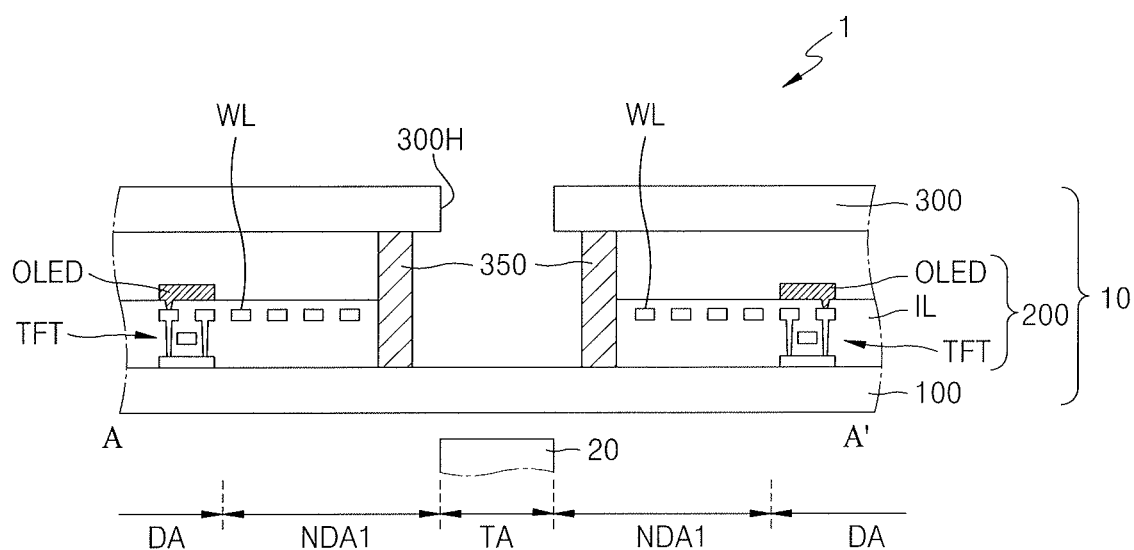
Figure 2C:
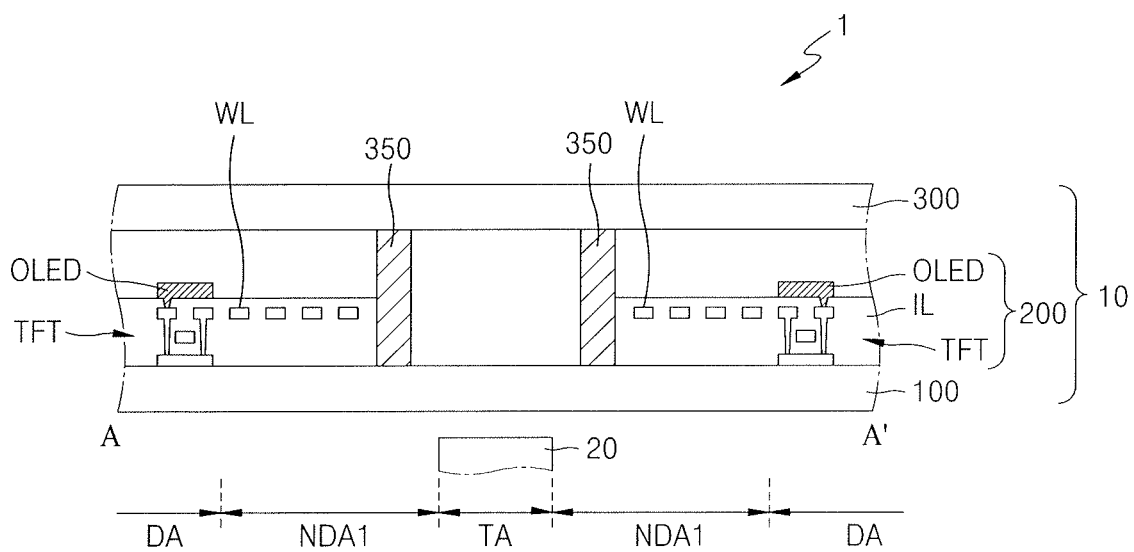

FIGS. 2A to 2C illustrate cross-sectional views of a display apparatus 1 according to embodiments taken along line A-A' of FIG. 1.

Referring to FIG. 2A, the display apparatus 1 may include a display panel 10 including display elements, and a component 20 corresponding to the transmission area TA.

The display panel 10 may include a substrate 100, an encapsulation substrate 300 that is an encapsulation member facing the substrate 100, and a display element layer 200 between the substrate 100 and the encapsulation substrate 300. A sealing material (sealant, 350) covering side surfaces of the display element layer 200 may be provided between the substrate 100 and the encapsulation substrate 300. In FIG. 2A, the sealant 350 is provided at opposite sides of the transmission area TA, but when it is seen from a direction perpendicular to a main surface of the substrate 100, it may be seen that the transmission area TA may be entirely surrounded by the sealant 350.

The substrate 100 may include glass or a polymer resin. The polymer resin may include a polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), etc. The substrate 100 including the polymer resin may have a flexible, rollable, or bendable characteristic. The substrate 100 may have a multi-layered structure including a layer including the polymer resin and an inorganic layer. The encapsulation substrate 300 may include glass or a polymer resin.

The display element layer 200 may include a circuit layer including a thin film transistor TFT, an organic light-emitting diode OLED that is a display element connected to the thin film transistor TFT, and an insulating layer IL between the thin film transistor TFT and the organic light-emitting diode OLED. The thin film transistor TFT and the organic light-emitting diode OLED connected to the thin film transistor TFT may be arranged in the display area DA. Some wirings WL in the display element layer 200 may be located in the first non-display area NDA1. The wirings WL may provide predetermined signals or voltages to pixels that are spaced apart from one another with the transmission area TA provided therebetween. In FIG. 2A it is illustrated that the wirings WL do not overlap the sealant 350 in the first non-display area NDA1. In some implementations, the sealant 350 may be partially arranged on the wirings WL.

The display panel 10 may include a through hole 10H corresponding to the transmission area TA. For example, the substrate 100 and the encapsulation substrate 300 may respectively include through holes 100H and 300H corresponding to the transmission area TA. The display element layer 200 may also include a through hole corresponding to the transmission area TA.

Components such as an input sensing member for sensing a touch input, an anti-reflection member including a polarizer and a retarder, or a color filter and a black matrix, a transparent window, etc. may be further arranged on the display panel 10.

The component 20 may be located in the transmission area TA. The component 20 may be an electronic element using light or sound. For example, the electronic element may include a light-receiving sensor such as an infrared-ray (IR) sensor, a camera capturing an image by receiving light, a sensor for outputting and sensing light or sound to measure a distance or recognize fingerprint, etc., a small-sized lamp illuminating light, a speaker for outputting sound, etc. The electronic element using light may use light of various wavelength bands such as visible light, IR, ultraviolet (UV) ray, etc. As shown in FIG. 2A, when the display panel 10 includes the through hole 10H corresponding to the transmission area TA, the light or sound output from or received by the electronic element may be effectively utilized.

While the display panel 10 of FIG. 2A is shown as including the through hole 10H corresponding to the transmission area TA, in some implementations, some components of the display panel 10 may not include a through hole. For example, the encapsulation substrate 300 may include the through hole 300H corresponding to the transmission area TA as shown in FIG. 2B, but the substrate 100 may not include a through hole. In some implementations, as shown in FIG. 2C, both the substrate 100 and the encapsulation substrate 300 may not include a through hole corresponding to the transmission area TA. Even when the substrate 100 does not include the through hole 100H as shown in FIGS. 2B and 2C, portions in the display element layer 200 corresponding to the transmission area TA may be removed to ensure light transmittance for the electronic elements. When the display apparatus 1 includes the display panel 10 shown in FIGS. 2B and 2C, it may be appropriate to use an electronic element that uses light.

The component 20 shown in FIGS. 2A to 2C may be located inside of the through hole 10H so as to overlap a side surface of the display panel 10 defining the through hole 10H.

The component 20 may be another member rather than an electronic element. In an embodiment, when the display panel 10 is used in a smart watch or an instrument panel for a vehicle, the component 20 may include a member having a clock needle or a needle indicating predetermined information (e.g., vehicle velocity, etc.). In some implementations, the component 20 may include an element such as an accessory for enhancing the aesthetic appearance of the display panel 10.

Figure 3A:
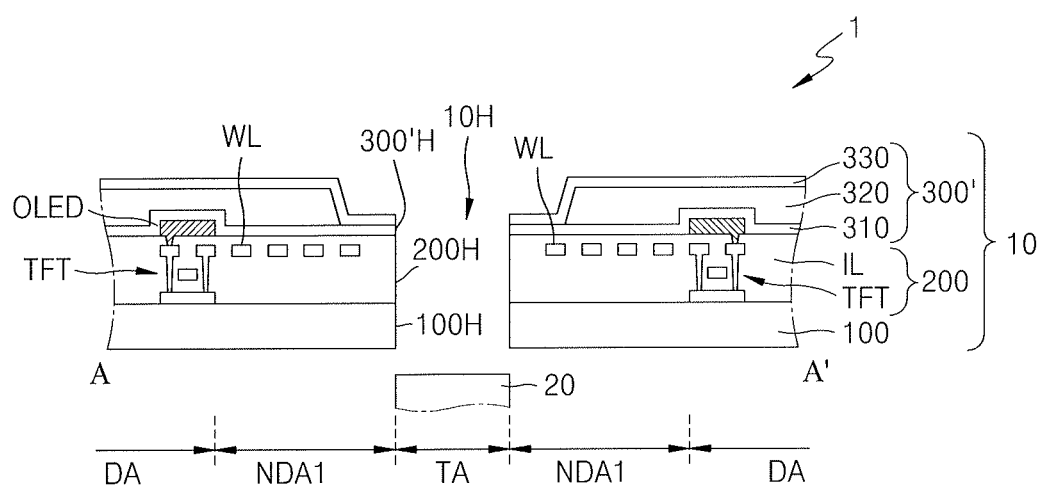
FIGS. 3A to 3C illustrate cross-sectional views of a display apparatus according to an embodiment.
Figure 3B:
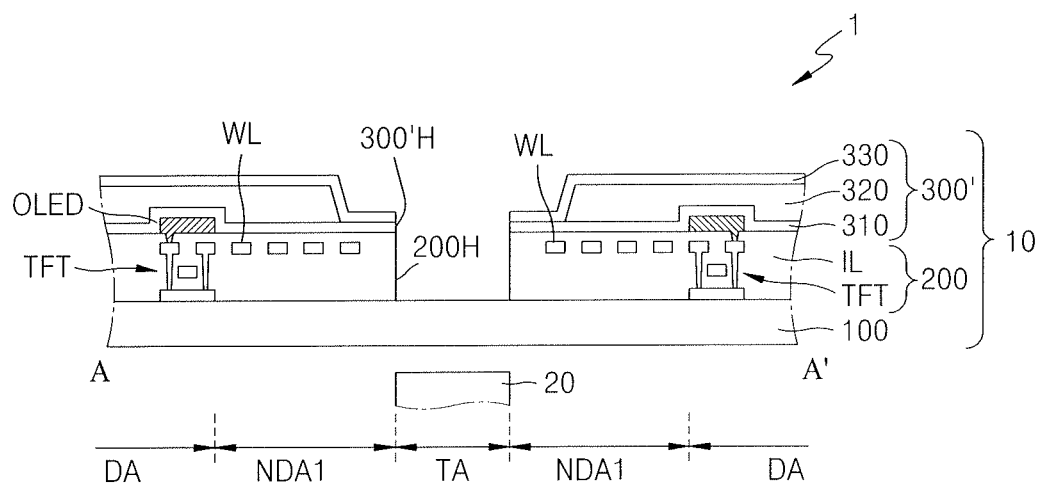
Figure 3C:
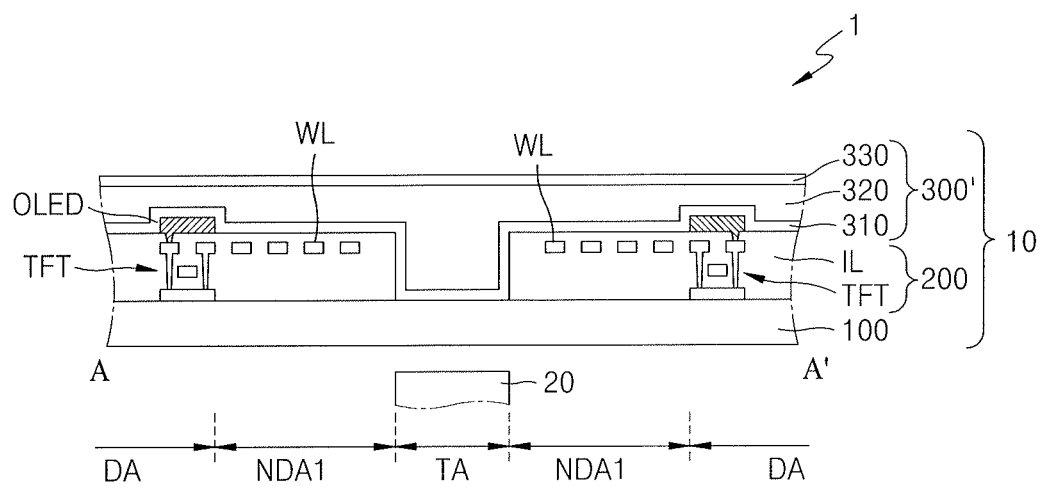

FIGS. 3A to 3C illustrate cross-sectional views of the display apparatus 1 according to an embodiment taken along line A-A' of FIG. 1.

Referring to FIG. 3A, the display apparatus 1 may include the display panel 10 and the component 20, like the display apparatus 1 described above with reference to FIG. 2A. The display apparatus 1 may further include an input sensing member for sensing a touch input, an anti-reflection member, a window, etc. arranged on the display panel 10.

Unlike the display panel 10 of FIG. 2A that includes the encapsulation substrate 300 and the sealant 350 as the encapsulation member, the display panel 10 according to another embodiment may include a thin film encapsulation layer 300' as the encapsulation member. In this case, flexibility of the display panel 10 may be further improved. Hereinafter, the above difference will be described for convenience of description.

The thin film encapsulation layer 300' may include at least one inorganic encapsulation layer and at least one organic encapsulation layer. In this regard, referring to FIG. 3A, the thin film encapsulation layer 300' may include first and second inorganic encapsulation layers 310 and 330, respectively, and an organic encapsulation layer 320 between the first and second inorganic encapsulation layers 310 and 330.

The first and second inorganic encapsulation layers 310 and 330 may each include one or more inorganic insulating materials among silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The organic encapsulation layer 320 may include a polymer-based material. The polymer-based material may include an acryl-based resin, an epoxy-based resin, polyimide, polyethylene, etc.

The display panel 10 may include a through hole 10H corresponding to the transmission area TA. For example, the substrate 100 and the thin film encapsulation layer 300' may respectively include through holes 100H and 300H' corresponding to the transmission area TA. The first and second inorganic encapsulation layers 310 and 330 and the organic encapsulation layer 320 may each include a hole corresponding to the transmission area TA. The hole in the organic encapsulation layer 320 may be greater than the holes in the first and second inorganic encapsulation layers 310 and 330, and thus the first and second inorganic encapsulation layers 310 and 330 may contact each other around the transmission area TA.

In some implementations, the display panel 10 may not include a through hole. The thin film encapsulation layer 300' may include the through hole 300H' corresponding to the transmission area TA as shown in FIG. 3B, but the substrate 100 may not include a through hole. In some implementations, as shown in FIG. 3C, both the substrate 100 and the thin film encapsulation layer 300' may not include a through hole corresponding to the transmission area TA. Even when the substrate 100 does not include the through hole 100H as shown in FIGS. 3B and 3C, portions in the display element layer 200 corresponding to the transmission area TA may be removed to ensure light transmittance for the electronic element, for example, the component 20, as described above.

When, as shown in FIG. 3C, the thin film encapsulation layer 300' does not include a through hole at least one inorganic encapsulation layer and at least one organic encapsulation layer may cover the substrate 100 in the transmission area TA. In this case, in the display element layer 200 between the substrate 100 and the thin film encapsulation layer 300', a portion corresponding to the transmission area TA may be removed. For example, in FIG. 3A, all the corresponding part of the insulating layer IL to the transmission area TA is removed. In some implementations, only some of the multiple layers in the insulating layer IL may be removed.

The component 20 may be located inside of the through hole 10H, for example, inside the through hole 100H and the through hole 200H of the display element layer 200 as shown in FIG. 3A, so as to overlap the side surface of the display panel 10 defining the through hole 10H, or inside the through hole 200H of the display element layer 200 as shown in FIG. 3B.

Figure 4:
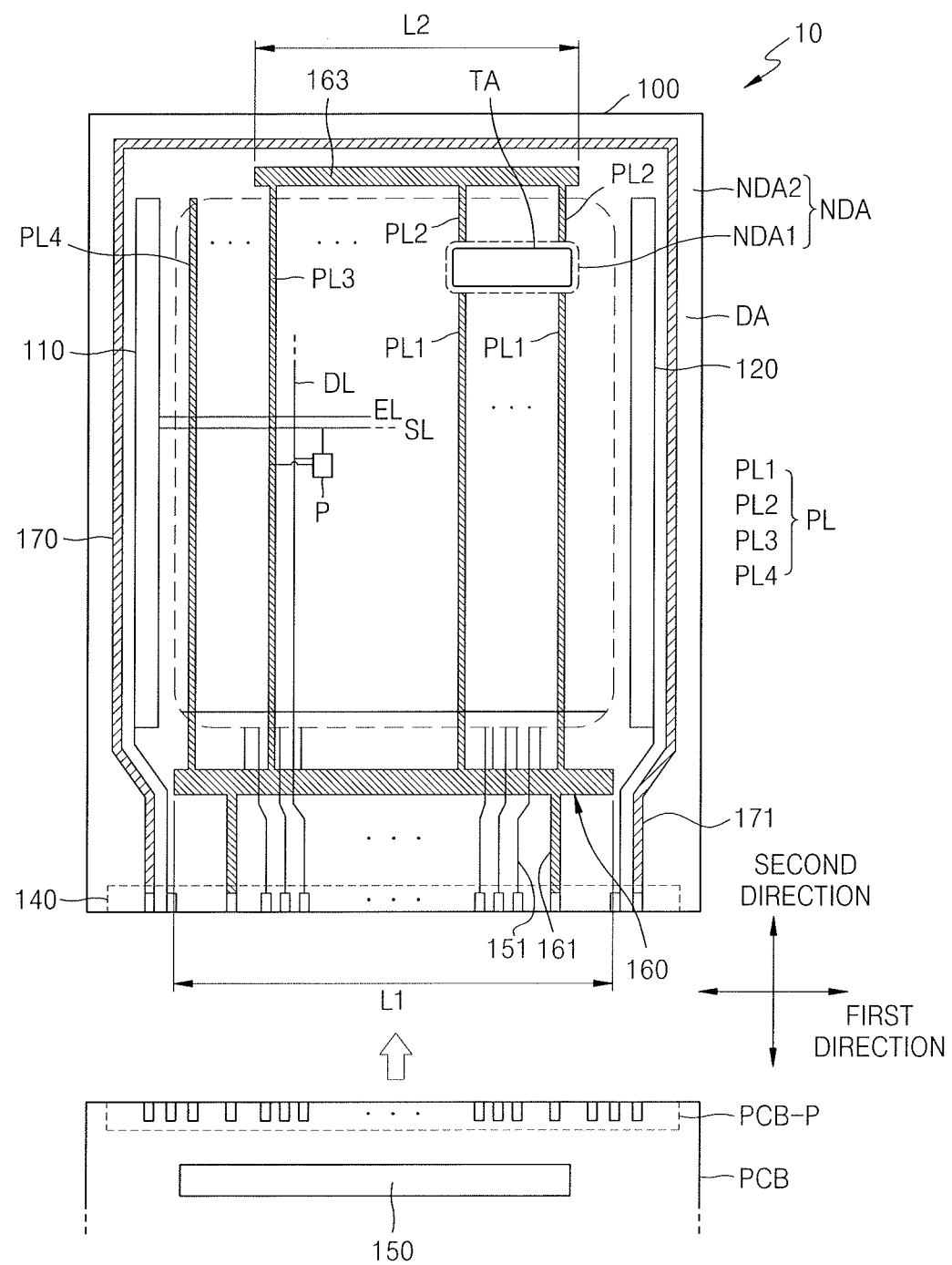
FIG. 4 illustrates a plan view of a display panel according to an embodiment.

FIG. 4 illustrates a plan view of the display panel 10 according to the embodiment.

Referring to FIG. 4, the display panel 10 may include a plurality of pixels P arranged in the display area DA. The pixels P may each include a display element such as an organic light-emitting diode. Each of the pixels P may emit light, e.g., red light, green light, blue light, or white light, via the organic light-emitting diode. In the specification, the pixel P may emit red light, green light, blue light, or white light, as described above. The display area DA may be covered by the encapsulation member described above with reference to FIGS. 2A to 3C, so as to be protected against external air or moisture.

The transmission area TA may be arranged in an inner portion of the display area DA, and the plurality of pixels P may be arranged around the transmission area TA. The plurality of pixels P may be arranged to surround the transmission area TA The first non-display area NDA1, on which the pixels P are not arranged, may be located between the transmission area TA and the display area DA. Wirings for applying predetermined signals or electric power to the pixels P, which are spaced apart from one another based on the transmission area TA, may detour in the first non-display area NDA1. In some implementations, some wirings may be disconnected at the transmission area TA.

Each of the pixels P may be electrically connected to external circuits arranged in the non-display area, e.g., the second non-display area NDA2. In the second non-display area NDA2, a first scan driving circuit 110, a second scan driving circuit 120, a terminal 140, a data driving circuit 150, a first power supply line 160, and a second power supply line 170 may be arranged.

The first scan driving circuit 110 may provide each pixel P with a scan signal via a scan line SL. The first scan driving circuit 110 may provide each pixel P with an emission control signal via an emission control line EL. The second scan driving circuit 120 may be arranged in parallel with the first scan driving circuit 110, with the display area DA arranged therebetween. Some of the pixels P arranged in the display area DA may be electrically connected to the first scan driving circuit 110. Other pixels P may be connected to the second scan driving circuit 120. In some implementations, the second scan driving circuit 120 may be omitted.

The terminal 140 may be arranged at a side of the substrate 100. The terminal 140 may not be covered by an insulating layer, but may be exposed. The terminal 140 may be electrically connected to a printed circuit board PCB. A terminal PCB-P of the printed circuit board PCB may be electrically connected to the terminal 140 of the display panel 10. The printed circuit board PCB may transfer a signal or a power of a controller to the display panel 10. A control signal generated by the controller may be respectively transferred to the first and second scan driving circuits 110 and 120 via the printed circuit board PCB. The controller may provide the first and second power supply lines 160 and 170 respectively with a driving voltage ELVDD and a common voltage ELVSS (see FIG. 5) via first and second connecting lines 161 and 171. The driving voltage ELVDD may be provided to each pixel P via a driving voltage line PL connected to the first power supply line 160, and the common voltage ELVSS may be provided to an opposite electrode of each of pixels P connected to the second power supply line 170. The second power supply line 170 may have a loop shape having an opening side to partially surround the display area DA.

The data driving circuit 150 may be electrically connected to a data line DL. A data signal of the data driving circuit 150 may be provided to each of the pixels P via a connecting line 151 connected to the terminal 140 and the data line DL connected to the connecting line 151. Although FIG. 4 shows that the data driving circuit 150 is arranged on the printed circuit board PCB, in some implementations, the data driving circuit 150 may be arranged on the substrate 100. For example, the data driving circuit 150 may be arranged between the terminal 140 and the first power supply line 160.

In an embodiment, a power bus line 163 may be connected to some of driving voltage lines PL and may extend in a first direction. As shown in FIG. 4, the power bus line 163 may be arranged in the second non-display area NDA2, and may extend in parallel to the first power supply line 160 in the first direction with the display area DA provided therebetween. In some implementations, the power bus line 163 may be arranged on the first non-display area NDA1 surrounding the transmission area TA. In some implementations, a plurality of power bus lines 163 may be provided, some of which may be arranged on the first non-display area NDA1 and some others of which may be arranged on the second non-display area NDA2.

The first power supply line 160 may be connected to the first connecting line 161 to be provided with the driving voltage ELVDD from the controller connected to the terminal 140. The power bus line 163 may not be directly connected to the terminal 140, but may be connected to the first power supply line 160 via the driving voltage line PL to receive the same voltage as that of the first power supply line 160.

In an embodiment, one end portions of driving voltage lines PL1, PL2, PL3, and PL4 may be connected to the first power supply line 160.

A plurality of first driving voltage lines PL1 may extend from the first power supply line 160 in a second direction. One end portions of the plurality of first driving voltage lines PL1 may be arranged at a side (lower side) of the transmission area TA. For example, one end portions of the plurality of first driving voltage lines PL1 may be arranged in the first non-display area NDA1. In some embodiments, the plurality of first driving voltage lines PL1 and the first power supply line 160 may be integrally provided with each other.

A plurality of second driving voltage lines PL2 may extend from the power bus line 163 in the second direction. One end portions of the plurality of second driving voltage lines PL2 may be arranged at an opposite side (upper side) of the transmission area TA. For example, one end portions of the plurality of second driving voltage lines PL2 may be arranged in the first non-display area NDA1. In some embodiments, the plurality of second driving voltage lines PL2 and the power bus line 163 may be integrally provided with each other. The plurality of first driving voltage lines PL1 and the plurality of second driving voltage lines PL2 may be spaced apart from each other with the transmission area TA provided therebetween.

A plurality of third driving voltage lines PL3 may extend in the second direction to be connected to the first power supply line 160 and the power bus line 163. In some embodiments, the plurality of third driving voltage lines PL3, the first power supply line 160, and the power bus line 163 may be provided integrally with one another.

A plurality of fourth driving voltage lines PL4 may extend from the first power supply line 160 in the second direction. One end portions of the plurality of fourth driving voltage lines PL4 may be arranged on the second non-display area NDA2. In some embodiments, the plurality of fourth driving voltage lines PL4 and the first power supply line 160 may be integrally provided with each other.

In some embodiments, a length L2 of the power bus line 163 in the first direction may be less than a length L1 of the first power supply line 160 in the first direction (L2<L1). In some implementations, the number of the plurality of driving voltage lines PL connected to the power bus line 163 may be less than the number of the plurality of driving voltage lines PL connected to the first power supply line 160.

The first power supply line 160 may be arranged to correspond to total columns of the pixels P arranged in the first direction to transfer the driving voltage ELVDD to each column of the pixels P. The power bus line 163, on the other hand, may be provided to prevent an IR drop of the second driving voltage lines PL2. The power bus line 163 may be arranged based on the transmission area TA. As described above, when the length of the power bus line 163 is reduced, utilization of the second non-display area NDA2 may be increased.

Figure 5:
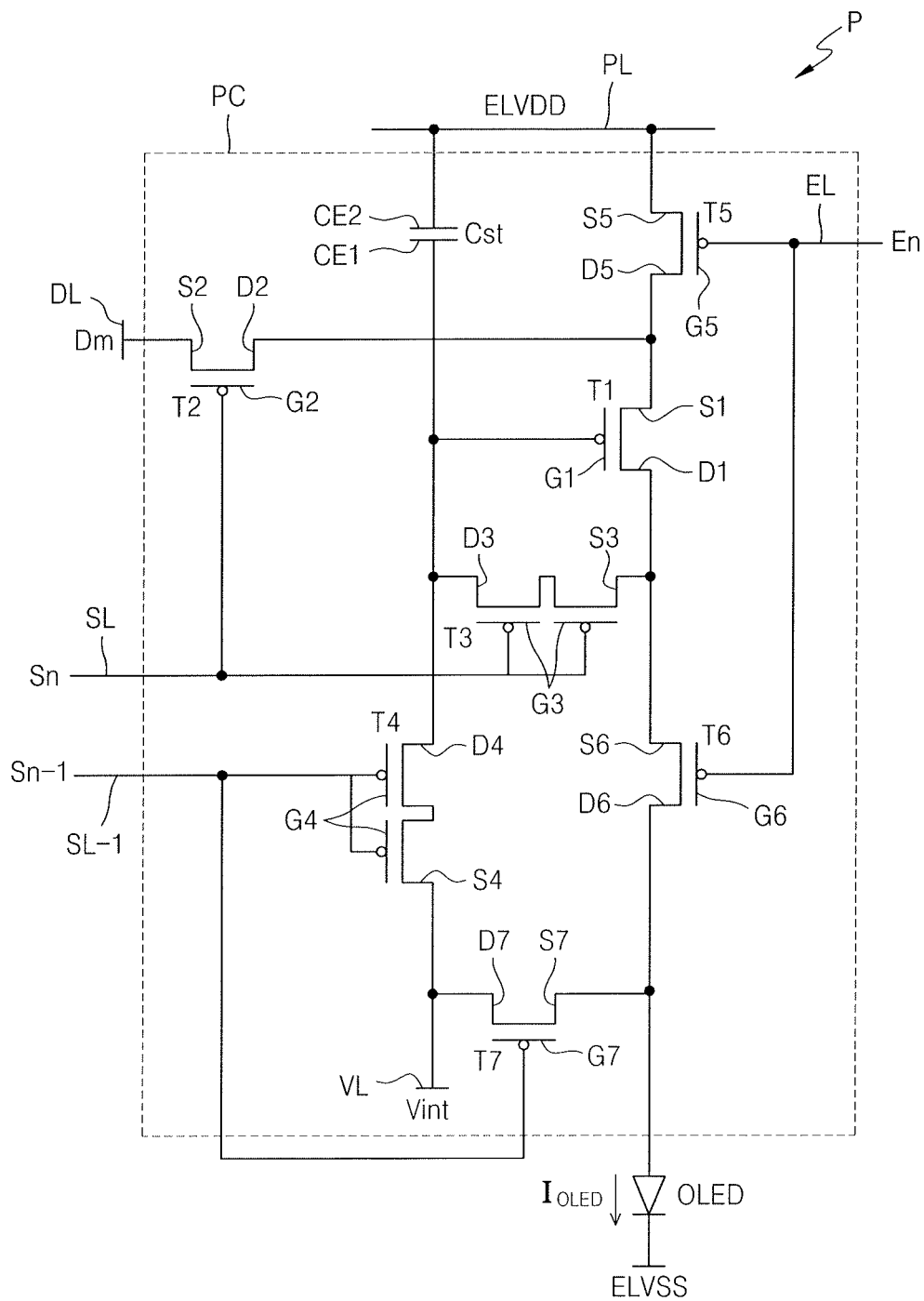
FIG. 5 illustrates an equivalent circuit diagram of a pixel in a display panel according to an embodiment.

FIG. 5 illustrates an equivalent circuit diagram of one pixel P in a display panel according to an embodiment.

Referring to FIG. 5, the pixel P includes a pixel circuit PC and an organic light-emitting diode OLED connected to the pixel circuit PC. The pixel circuit PC may include a plurality of thin film transistors and a storage capacitor. The thin film transistors and the storage capacitor may be connected to signal lines SL, SL-1, EL, and DL, an initialization voltage line VL, and a driving voltage line PL.

In FIG. 5, each pixel P may be connected, for example, to the signal lines SL, SL-1, EL, and DL, the initialization voltage line VL, and the driving voltage line PL. In some implementations, at least one of the signal lines SL, SL-1, EL, and DL, the initialization voltage line VL, and the driving voltage line PL may be shared by neighboring pixels P.

The plurality of thin film transistors may include a driving TFT T1, a switching TFT T2, a compensation TFT T3, a first initialization TFT T4, an operation control TFT T5, an emission control TFT T6, and a second initialization TFT T7.

The signal lines include the scan line SL transferring a scan signal Sn, a previous scan line SL-1 transferring a previous scan signal Sn-1 to the first initialization TFT T4 and the second initialization TFT T7, an emission control line EL transferring an emission control signal En to the operation control TFT T5 and the emission control TFT T6, and a data line DL intersecting with the scan line SL and transferring a data signal Dm. The driving voltage line PL may transfer the driving voltage ELVDD to the driving TFT T1. The initialization voltage line VL may transfer an initialization voltage Vint for initializing the driving TFT T1 and the pixel electrode.

A driving gate electrode G1 of the driving TFT T1 may be connected to a first storage capacitor plate CE1 of the storage capacitor Cst. A driving source electrode S1 of the driving TFT T1 may be connected to the driving voltage line PL via the operation control TFT T5. A driving drain electrode D1 of the driving TFT T1 may be electrically connected to the pixel electrode of the organic light-emitting diode OLED via the emission control TFT T6. The driving TFT T1 receives the data signal Dm according to a switching operation of the switching TFT T2 to supply a driving current $I_{OLED}$ to the organic light-emitting diode OLED.

A switching gate electrode G2 of the switching TFT T2 may be connected to the scan line SL. A switching source electrode S2 of the switching TFT T2 may be connected to the data line DL. A switching drain electrode D2 of the switching TFT T2 may be connected to the driving source electrode S1 of the driving TFT T1 and at the same time, may be connected to the driving voltage line PL at the lower side via the operation control TFT T5. The switching TFT T2 may be turned on according to the scan signal Sn received through the scan line SL and may perform a switching operation that transfers the data signal Dm transferred through the data line DL to the driving source electrode S1 of the driving TFT T1.

A compensation gate electrode G3 of the compensation TFT T3 may be connected to the scan line SL. A compensation source electrode S3 of the compensation TFT T3 may be connected to the driving drain electrode D1 of the driving TFT T1 and at the same time may be connected to the pixel electrode of the organic light-emitting diode OLED via the emission control TFT T6. A compensation drain electrode D3 of the compensation TFT T3 may be connected to the first storage capacitor plate CE1 of the storage capacitor Cst, a first initialization drain electrode D4 of the first initialization TFT T4, and the driving gate electrode G1 of the driving TFT T1. The compensation TFT 13 may be turned on according to the scan signal Sn received through the scan line SL to electrically connect the driving gate electrode G1 and the driving drain electrode D1 of the driving TFT T1 to each other and to diode-connect the driving TFT T1.

A first initialization gate electrode G4 of the first initialization TFT T4 may be connected to the previous scan line SL-1. A first initialization source electrode S4 of the first initialization TFT T4 may be connected to a second initialization drain electrode D7 of the second initialization TFT T7 and the initialization voltage line VL. The first initialization drain electrode D4 of the first initialization TFT T4 may be connected to the first storage capacitor plate CE1 of the storage capacitor Cst, the compensation drain electrode D3 of the compensation TFT T3, and the driving gate electrode G1 of the driving TFT T1. The first initialization TFT T4 may be turned on according to a previous scan signal Sn-1 transferred through the previous scan line SL-1 to transfer the initialization voltage Vint to the driving gate electrode G1 of the driving TFT T1 and perform an initialization operation for initializing a voltage at the driving gate electrode G1 of the driving TFT T1.

An operation control gate electrode G5 of the operation control TFT T5 may be connected to the emission control line EL. An operation control source electrode S5 of the operation control TFT T5 may be connected to the driving voltage line PL at the lower side. An operation control drain electrode D5 of the operation control TFT T5 may be connected to the driving source electrode S1 of the driving TFT T1 and the switching drain electrode D2 of the switching TFT T2.

An emission control gate electrode G6 of the emission control TFT T6 may be connected to the emission control line EL. An emission control source electrode S6 of the emission control TFT T6 may be connected to the driving drain electrode D1 of the driving TFT T1 and the compensation source electrode S3 of the compensation TFT T3. An emission control drain electrode D6 of the emission control TFT T6 may be electrically connected to a second initialization source electrode S7 of the second initialization TFT T7 and the pixel electrode of the organic light-emitting diode OLED.

The operation control TFT T5 and the emission control TFT T6 may be simultaneously turned on according to the emission control signal En transferred through the emission control line EL to transfer the driving voltage ELVDD to the organic light-emitting diode OLED and to allow a driving current IOLED to flow in the organic light-emitting diode OLED.

The second initialization gate electrode G7 of the second initialization TFT T7 may be connected to the previous scan line SL-1. A second initialization source electrode S7 of the second initialization TFT T7 may be connected to the emission control drain electrode D6 of the emission control TFT T6 and the pixel electrode of the organic light-emitting diode OLED. A second initialization drain electrode D7 of the second initialization TFT T7 may be connected to the first initialization source electrode S4 of the first initialization TFT T4 and the initialization voltage line VL. The second initialization TFT T7 may be turned on according to the previous scan signal Sn-1 transferred through the previous scan line SL-1 to initialize the pixel electrode of the organic light-emitting diode OLED.

In FIG. 5, the first initialization TFT T4 and the second initialization TFT T7 are shown as being connected to the previous scan line SL-1. In some implementations, the first initialization TFT T4 may be connected to the previous scan line SL-1 to operate according to the previous scan signal Sn-1, and the second initialization TFT T7 may be connected to a separate signal line (e.g., a post scan line) to operate according to a signal transferred to the signal line.

A second storage capacitor plate CE2 of the storage capacitor Cst may be connected to the driving voltage line PL. An opposite electrode of the organic light-emitting diode OLED may be connected to the common voltage ELVSS. Accordingly, the organic light-emitting diode OLED may emit light by receiving the driving current $I_{OLED}$ from the driving TFT T1 to display images.

In FIG. 5, the compensation TFT T3 and the first initialization TFT T4 are shown as having dual-gate electrodes. In some implementations, the compensation TFT T3 and the first initialization TFT T4 may each have one gate electrode.

Figure 6A:
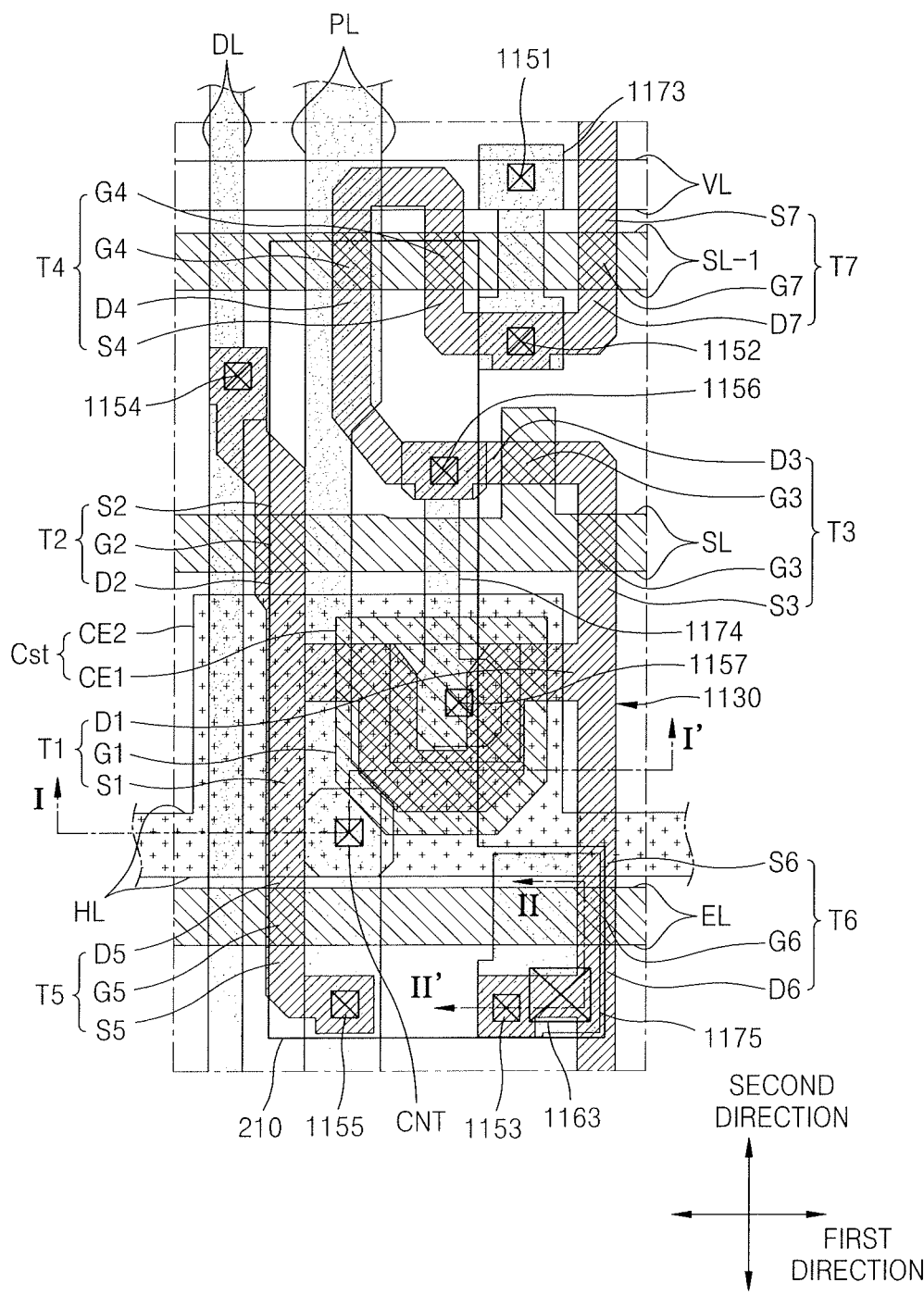
FIG. 6A illustrates a plan view of a pixel circuit of a pixel in a display panel according to an embodiment.

FIG. 6A illustrates a plan view of a pixel circuit of one pixel in a display panel according to an embodiment.

Referring to FIG. 6A, the driving TFT T1, the switching TFT T2, the compensation TFT T3, the first initialization TFT T4, the operation control TFT T5, the emission control TFT T6, and the second initialization TFT T7 may be arranged along a semiconductor layer 1130. The semiconductor layer 1130 may be arranged on a substrate on which a buffer layer including an inorganic insulating material is arranged.

Some regions in the semiconductor layer 1130 correspond to semiconductor layers of the driving TFT T1, the switching TFT T2, the compensation TFT T3, the first initialization TFT T4, the operation control TFT T5, the emission control TFT T6, and the second initialization TFT T7. For example, the semiconductor layers of the driving TFT T1, the switching TFT T2, the compensation TFT T3, the first initialization TFT T4, the operation control TFT T5, the emission control TFT T6, and the second initialization TFT T7 may be connected to one another and curved in various shapes.

The semiconductor layer 1130 may include a channel region, and a source region and a drain region at opposite sides of the channel region. The source region and the drain region may be recognized respectively as a source electrode and a drain electrode of a corresponding TFT. Hereinafter, the source region and the drain region will be referred to as a source electrode and a drain electrode, for convenience of description.

The driving TFT T1 may include the driving gate electrode G1 overlapping a driving channel region, and the driving source electrode S1 and the driving drain electrode D1 at opposite sides of the driving channel region. The driving channel region overlapping the driving gate electrode G1 may have a bent shape, e.g., an omega shape, to establish a long channel length within a narrow space. When the driving channel region has a long length, a driving range of a gate voltage increases, and thus, a gray level of light emitted from the organic light-emitting diode OLED may be finely controlled and quality of displaying image may be improved.

The switching TFT T2 may include the switching gate electrode G2 overlapping a switching channel region, and the switching source electrode S2 and the switching drain electrode D2 at opposite sides of the switching channel region. The switching drain electrode D2 may be connected to the driving source electrode S1.

The compensation TFT T3 may be a dual-TFT including compensation gate electrodes S3 respectively overlapping two compensation channel regions, and a compensation source electrode S3 and the compensation drain electrode D3 at opposite sides of two compensation channel region. The compensation TFT T3 may be connected to the driving gate electrode G1 of the driving TFT T1 via a node connecting line 1174 that will be described below.

The first initialization TFT T4 may be a dual-TFT including first initialization gate electrodes G4 respectively overlapping two first initialization channel regions, and the first initialization source electrode S4 and the first initialization drain electrode D4 at opposite sides of two first initialization channel regions.

The operation control TFT T5 may include the operation control gate electrode G5 overlapping an operation control channel region, and the operation control source electrode S5 and the operation control drain electrode D5 at opposite sides of the operation control gate electrode G5. The operation control drain electrode D5 may be connected to the driving source electrode S1.

The emission control TFT T6 may include the emission control gate electrode G6 overlapping an emission control channel region, and the emission control source electrode S6 and the emission control drain electrode D6 at opposite sides of the emission control gate electrode G6. The emission control source electrode S6 may be connected to the driving drain electrode D1.

The second initialization TFT T7 may include the second initialization gate electrode G7 overlapping a second initialization channel region, and the second initialization source electrode S7 and the second initialization drain electrode D7 at opposite sides of the second initialization gate electrode G7.

The above TFTs may be connected to the signal lines SL, SL-1, EL, and DL, the initialization voltage line VL, and the driving voltage line PL.

The scan line SL, the previous scan line SL-1, the emission control line EL, and the driving gate electrode G1 may be arranged on the semiconductor layer 1130 as insulating layer(s) provided therebetween.

The scan line SL may extend in the first direction. Some regions in the scan line SL may correspond to the switching and compensation gate electrodes G2 and G3. For example, regions in the scan line SL overlapping the channel regions of the switching and compensation TFTs T2 and T3 may be the switching and compensation gate electrodes G2 and G3, respectively.

The previous scan line SL-1 may extend along the first direction. Some regions of the previous scan line SL-1 may correspond to the first and second initialization gate electrodes G4 and G7. For example, regions in the previous scan line SL-1 overlapping the channel regions of the switching and compensation TFTs T2 and T3 may be the switching and compensation gate electrodes G2 and G3, respectively.

The emission control line EL may extend along the first direction. Some regions in the emission control line EL may correspond to the operation control and emission control gate electrodes G5 and G6. For example, regions in the emission control line EL overlapping the channel regions of the operation control and emission control TFTs T5 and T6 may be the operation control and emission control gate electrodes G5 and G6, respectively.

The driving gate electrode G1 may be a floating electrode that is connected to the compensation TFT T3 via the node connecting line 1174.

An electrode voltage line HL may be arranged on the scan line SL, the previous scan line SL-1, the emission control line EL, and the driving gate electrode G1 with insulating layer(s) provided therebetween.

The electrode voltage line HL may extend in the first direction to intersect with the data line DL and the driving voltage line PL. A part of the electrode voltage line HL may cover at least a part of the driving gate electrode G1 and may configure the storage capacitor Cst with the driving gate electrode G1. For example, the driving gate electrode G1 may become the first storage capacitor plate CE1 of the storage capacitor Cst, and a part of the electrode voltage line HL may become the second storage capacitor plate CE2 of the storage capacitor Cst.

The second storage capacitor plate CE2 of the storage capacitor Cst may be electrically connected to the driving voltage line PL. For example, the electrode voltage line HL may be connected to the driving voltage line PL on the electrode voltage line EL via a contact hole CNT. The electrode voltage line HL may have the same voltage level (constant voltage) as the driving voltage line PL. For example, the electrode voltage line HL may have a constant voltage of +5V. The electrode voltage line EL may be recognized as the driving voltage line in a transverse direction.

The driving voltage line PL may extend along the second direction. The electrode voltage line HL electrically connected to the driving voltage line PL may extend along the first direction intersecting with the second direction. The plurality of driving voltage lines PL and electrode voltage lines HL in the display area may generate a mesh structure.

In the embodiment, the electrode voltage line HL may be arranged at a different layer from the driving voltage line PL. A specific resistance of the electrode voltage line HL may be greater than that of the driving voltage line PL.

The data line DL, the driving voltage line PL, an initialization connecting line 1173, and the node connecting line 1174 may be arranged on the electrode voltage line HL with insulating layer(s) provided therebetween.

The data line DL may extend in the second direction. The data line DL may be connected to the switching source electrode S2 of the switching TFT T2 via a contact hole 1154. A part of the data line DL may be recognized as the switching source electrode.

The driving voltage line PL may extend in the second direction. As described above, the driving voltage line PL may be connected to the electrode voltage line HL via the contact hole CNT. The driving voltage line PL may be connected to the operation control TFT T5 via a contact hole 1155. The driving voltage line PL may be connected to the operation control drain electrode D5 via the contact hole 1155.

An end of the initialization connecting line 1173 may be connected to the first and second initialization TFTs T4 and T7 via a contact hole 1152. The other end of the initialization connecting line 1173 may be connected to the initialization voltage line VL (described below) via a contact hole 1151.

An end of the node connecting line 1174 may be connected to the compensation drain electrode D3 via a contact hole 1156. Another end of the node connecting line 1174 may be connected to the driving gate electrode G1 via a contact hole 1157.

The initialization voltage line VL may be arranged on the data line DL, the driving voltage line PL, the initialization connecting line 1173, and the node connecting line 1174 with insulating layer(s) provided therebetween.

The initialization voltage line VL may extend in the first direction. The initialization voltage line VL may be connected to the first and second initialization TFTs T4 and T7 via the initialization connecting line 1173. The initialization voltage line VL may have a constant voltage (e.g., −2V, etc.).

The initialization voltage line VL may be arranged at the same layer as that of a pixel electrode 210 of the organic light-emitting diode OLED (see FIG. 5). The initialization voltage line VL may include the same material as that of the pixel electrode. The pixel electrode 210 may be connected to the emission control TFT T6. The pixel electrode 210 may be connected to a connection metal 1175 via a contact hole 1163. The connection metal 1175 may be connected to the emission control drain electrode D6 via the contact hole 1153.

In FIG. 6A, the initialization voltage line VL is shown as being arranged at the same layer as that of the pixel electrode 210. In some implementations, the initialization voltage line VL may be arranged at the same layer as the electrode voltage line HL.

Also, in FIGS. 5 and 6A, the pixel circuit PC is shown as including seven TFTs and one storage capacitor. In some implementations, the number of the TFTs and the number of the storage capacitor may be different depending on a design of the pixel circuit PC.

Figure 6B:
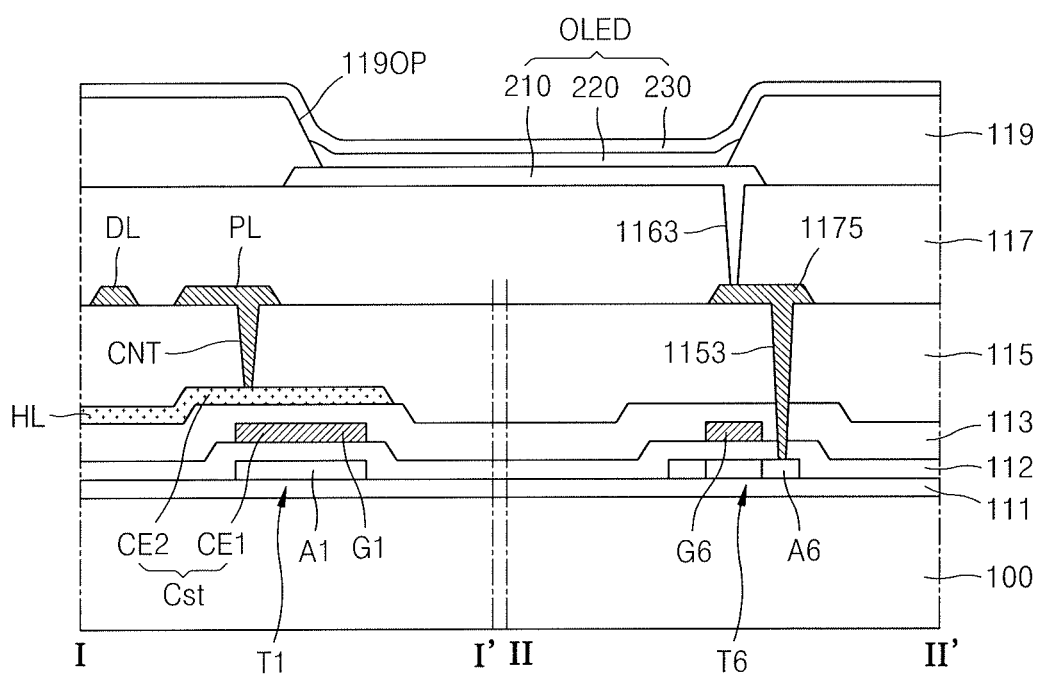
FIG. 6B illustrates a cross-sectional view of an organic light-emitting device taken along line I-I' and line II-II' of FIG. 6A.

Hereinafter, a stack structure of the components included in the display panel according to an embodiment will be described with reference to FIG. 6B. FIG. 6B illustrates a cross-sectional view taken along line I-I' and II-II' of FIG. 6A including the organic light-emitting diode OLED.

The substrate 100 may include glass or a polymer resin. The polymer resin may include a polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), etc. The substrate 100 including the polymer resin may have a flexible, rollable, or bendable characteristic. The substrate 100 may have a multi-layered structure including a layer including the polymer resin and an inorganic layer.

A buffer layer 111 may be located on the substrate 100 to reduce or block the infiltration of impurities, moisture, or external air from a lower portion of the substrate 100, and to provide a flat surface on the substrate 100. The buffer layer 111 may include an inorganic material such as an oxide material or a nitride material, an organic material, or an inorganic-organic composite material. The buffer layer 111 may have a single-layered or multi-layered structure including the inorganic material and the organic material. A barrier layer for preventing the infiltration of external air may be further provided between the substrate 100 and the buffer layer 111.

Semiconductor layers A1 and A6 may each include amorphous silicon or polysilicon. In some implementations, the semiconductor layers A1 and A6 may each include an oxide of at least one selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layers A1 and A6 may each include a channel region, and a source region and a drain region doped with impurities.

The gate electrodes G1 and G6 may be arranged respectively on the semiconductor layers A1 and A6 with a first gate insulating layer 112 arranged therebetween. The gate electrodes G1 and G6 may each include molybdenum (Mo), aluminum (Al), copper (Cu), titanium (Ti), etc., and may have a single-layered or multi-layered structure. As an example, the gate electrode G1 and G6 may each have a single layer including Mo. The scan line SL (see FIG. 6A), the previous scan line SL-1, and the emission control line EL may be provided at the same layer as the gate electrodes G1 and G6. For example, the gate electrodes G1 and G6, the scan line SL (see FIG. 6A), the previous scan line SL-1, and the emission control line EL may be arranged on the first gate insulating layer 112.

The first gate insulating layer 112 may include an insulating material such as silicon oxide ($SiO_2$), silicon nitride ($SiNx$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

A second gate insulating layer 113 may be provided to cover the gate electrodes G1 and G6. The second gate insulating layer 113 may include an insulating material such as silicon oxide ($SiO_2$), silicon nitride ($SiNx$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The first storage capacitor plate CE1 of the storage capacitor Cst may be integrally provided with the gate electrode G1 of the driving TFT T1. For example, the gate electrode G1 of the driving TFT T1 may function as the first storage capacitor plate CE1 of the storage capacitor Cst.

The second storage capacitor plate CE2 of the storage capacitor Cst may overlap the first storage capacitor plate CE1 with the second gate insulating layer 113 arranged therebetween. In this case, the second gate insulating layer 113 may function as a dielectric layer of the storage capacitor Cst. The second storage capacitor plate CE2 may include a conductive material including Mo, Al, Cu, Ti, etc., and may have a single-layered or multi-layered structure. As an example, the second storage capacitor plate CE2 may be in a form of a single layer including Mo or may be a multi-layered structure including Mo/Al/Mo.

In the drawings, the storage capacitor Cst is shown to overlap the driving TFT T1. In some implementations, the storage capacitor Cst may be variously modified. For example, the storage capacitor Cst may be arranged so as not to overlap the driving TFT T1.

The second storage capacitor plate CE2 may function as the electrode voltage line HL. For example, a part of the electrode voltage line HL may function as the second storage capacitor plate CE2 of the storage capacitor Cst.

An interlayer insulating layer 115 may be provided to cover the second storage capacitor plate CE2. The interlayer insulating layer 115 may include an insulating material such as silicon oxide ($SiO_2$), silicon nitride ($SiNx$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The data line DL, the driving voltage line PL, and the connection metal 1175 may be arranged on the interlayer insulating layer 115. The data line DL, the driving voltage line PL, and the connection metal 1175 may include a conductive material including Mo, Al, Cu, Ti, etc., and may have a single-layered or multi-layered structure including the above materials. For example, each of the data line DL, the driving voltage line PL, and the connection metal 1175 may have a multi-layered structure including Ti/Al/Ti.

The data line DL and the driving voltage line PL may be arranged throughout the display area to transfer signals or voltage to a plurality of pixels. A specific resistance of the data line DL and the driving voltage line PL may be less than that of the second storage capacitor plate CE2 or the electrode voltage line HL. In some embodiments, the specific resistance of the data line DL and the driving voltage line PL may be about 1/10 of that of the second storage capacitor plate CE2 or the electrode voltage line HL.

The second storage capacitor plate CE2 of the storage capacitor Cst may be connected to the driving voltage line PL via the contact hole CNT defined in the interlayer insulating layer 115. The electrode voltage line HL may be connected to the driving voltage line PL via the contact hole CNT. The electrode voltage line HL may have the same voltage level (constant voltage) as the driving voltage line PL.

The connection metal 1175 may be connected to the semiconductor layer A6 of the emission control TFT T6 via the contact hole 1153, which penetrates through the interlayer insulating layer 115, the second gate insulating layer 113, and the first gate insulating layer 112. The emission control TFT T6 may be electrically connected to the pixel electrode 210 of the organic light-emitting diode OLED via the connection metal 1175.

A planarization layer 117 may be located on the data line DL, the driving voltage line PL, and the connection metal 1175. The organic light-emitting diode OLED may be located on the planarization layer 117.

The planarization layer 117 may have a flat upper surface such that the pixel electrode 210 formed thereon will be flat. The planarization layer 117 may include a single-layered or multi-layered structure including an organic material. The planarization layer 117 may include a general universal polymer (benzocyclobutene (BCB), polyimide, hexamethyldisiloxane (HMDSO), polymethylmethacrylate (PMMA), or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. The planarization layer 117 may include an inorganic material. The planarization layer 117 may include an insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). When the planarization layer 117 includes the inorganic material, a chemical planarization polishing may be performed as desired. In some implementations, the planarization layer 117 may include both an organic material and an inorganic material.

The planarization layer 117 may include a contact hole 1163 to expose the connection metal 1175. The pixel electrode 210 may be connected to the connection metal 1175 via the contact hole 1163.

The pixel electrode 210 may be a (semi-) transmissive electrode or a reflective electrode. In some embodiments, the pixel electrode 210 may include a reflective layer including Ag, Mg, Al, Pt, Pd, Au, Ni, Nd, Ir, Cr, and a compound thereof, and a transparent or semi-transparent electrode layer on the reflective layer. The transparent or semi-transparent electrode layer may include at least one electrode material selected from indium tin oxide (ITO), indium zinc oxide (IZO), zinc oxide (ZnO), indium oxide ($In_2O_3$), indium gallium oxide, and aluminum zinc oxide (AZO). In some embodiments, the pixel electrode 210 may include a stack structure including ITO/Ag/ITO.

A pixel defining layer 119 may be located on the planarization layer 117. The pixel defining layer 119 may include an opening 119OP exposing a center portion of the pixel electrode 210 to define a light emitting region of the pixel. The pixel defining layer 119 may increase a distance between an edge of the pixel electrode 210 and an opposite electrode 230 on the pixel electrode 210 to prevent generation of an arc at the edge of the pixel electrode 210. The pixel defining layer 119 may include an organic insulating material such as polyimide, polyamide, an acrylic resin, BCB, HMDSO, and a phenol resin. The pixel defining layer 119 may be obtained by a spin coating, etc.

The intermediate layer 220 of the organic light-emitting diode OLED may include an organic light-emitting layer. The organic light-emitting layer may include an organic material including a fluorescent or phosphor material emitting red, green, blue, or white light. The organic light-emitting layer may include a low-molecular organic material or a polymer organic material. Functional layers such as a hole transport layer (HTL), a hole injection layer (HIL), an electron transport layer (ETL), and an electron injection layer (EIL) may be selectively arranged under and on the organic light-emitting layer. The intermediate layer 220 may correspond to each of the plurality of pixel electrodes 210. In some implementations, the intermediate layer 220 may be variously modified. For example, the intermediate layer 220 may be arranged throughout the plurality of pixel electrodes 210.

The opposite electrode 230 may be a transmissive electrode or a reflective electrode. In some embodiments, the opposite electrode 230 may be a transparent or a semi-transparent electrode, and may be provided as a metal thin film including Li, Ca, LiF/Ca, LiF/Al, Al, Ag, Mg, and a compound thereof having a small work function. A transparent conductive oxide (TCO) such as ITO, IZO, ZnO, or $In_2O_3$ may be further provided over the metal thin film. The opposite electrode 230 may be arranged throughout the display area DA and a peripheral area PA, and on the intermediate layer 220 and the pixel defining layer 119. The opposite electrode 230 may be provided integrally with respect to the plurality of organic light-emitting diodes OLED to correspond to the plurality of pixel electrodes 210.

When the pixel electrode 210 is a reflective electrode and the opposite electrode 230 is a transmissive electrode, light emitted from the intermediate layer 220 may be emitted towards the opposite electrode 230. For example, the display apparatus may be a top emission type. When the pixel electrode 210 is a transparent or a semi-transparent electrode and the opposite electrode 230 is a reflective electrode, the light emitted from the intermediate layer 220 may be discharged towards the substrate 100 and the display apparatus may be a bottom emission type. In some implementations, the display apparatus may be a dual-emission type in which light is emitted to the top and bottom surfaces.

Figure 7:
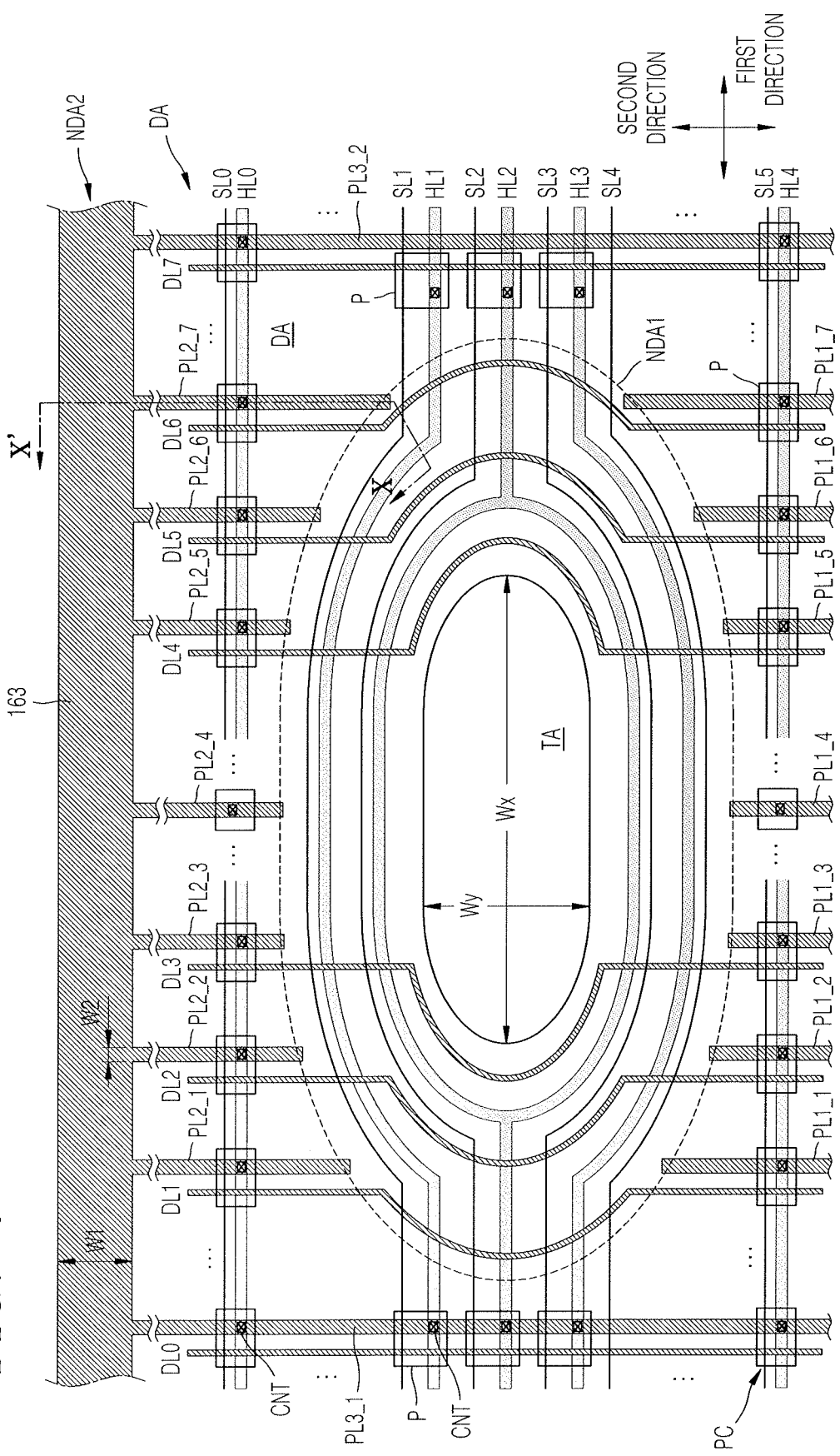
FIG. 7 illustrates a plan view of wirings around a transmission area according to an embodiment.

FIG. 7 illustrates a plan view showing arrangement of wirings around the transmission area TA according to an embodiment.

Referring to FIG. 7, scan lines SL0 to SL5 may extend in the first direction, and data lines DL0 to DL7 may extend in the second direction and intersect the scan lines SL0 to SL5.

Some scan lines SL1 to SL4 may detour around the transmission area TA. For example, first and second scan lines SL1 and SL2 may be curved along an upper edge of the transmission area TA, and third and fourth scan lines SL3 and SL4 may be curved along a lower edge of the transmission area TA. Each of the scan lines SL1 to SL4 may include a part extending along the first direction in the display area DA, and an arched part (or curved part) around the edge of the transmission area TA in the first non-display area NDA1. The pixels P at left and right sides of the transmission area TA may be electrically connected to the arched parts of the scan lines SL1 to SL4 around the transmission area TA.

Some data lines DL1 to DL6 may be arched around the transmission area TA. For example, each of the data lines DL1 to DL6 may include a part extending in the second direction and an arched part around the edge of the transmission area TA. The arched part in each of the data lines DL1 to DL6 may be in the first non-display area NDA1.

The pixels P on and under the transmission area TA may be electrically connected to the data lines DL1 to DL6 arched around the transmission area TA. The pixels PA may receive a signal from a corresponding data line from among the data lines DL1 to DL6. From among the data lines DL1 to DL6, the first to third data lines DL1 to DL3 may be curved along a left edge of the transmission area TA, and the fourth to sixth data lines DL4 to DL6 may be curved around a right edge of the transmission area TA.

Driving voltage lines PL1_1 to PL1_7, PL2_1 to PL2_7, PL3_1 and PL3_2 may be arranged at the same layer as the data lines DL1 to DL6 to be spaced apart from one another. The driving voltage lines PL1_1 to PL1_7, PL2_1 to PL2_7, PL3_1 and PL3_2 may extend in the second direction to intersect with the scan lines SL1 to SL4. Some driving voltage lines PL3_1 and PL3_2 from among the driving voltage lines PL may continuously extend to pass through the display area DA. The driving voltage lines PL1_1 to PL1_7 and PL2_1 to PL2_7 around the transmission area TA may be disconnected at the transmission area TA. For example, a plurality of first driving voltage lines PL1_1 to PL1_7 and a plurality of second driving voltage lines PL2_1 to PL2_7 may be spaced apart from each other with the transmission area TA therebetween.

The plurality of first driving voltage lines PL1_1 to PL1_7 may be connected to the first power supply line 160 described above with reference to FIG. 4. The plurality of second driving voltage lines PL2_1 to PL2_7 may be connected to the power bus line 163.

Electrode voltage lines HL0 to HL4 may extend in the first direction intersecting with the driving voltage lines PL1_1 to PL1_7, PL2_1 to PL2_7, PL3_1 and PL3_2. Some electrode voltage lines HL1 to HL3 may detour around the transmission area TA. For example, the first electrode voltage line HL1 and the third electrode voltage line HL3 may each include a part extending in the first direction and a part arched around an upper portion of the transmission area TA. The second electrode voltage line HL2 may include a part extending in the first direction and parts arched respectively around upper and lower portions of the transmission area TA. The arched parts in the second electrode voltage line HL2 may be connected to each other to provide a ring shape.

The driving voltage lines PL1_1 to PL1_7, PL2_1 to PL2_7, PL3_1 and PL3_2 and the electrode voltage lines HL0 to HL4 may be connected to the pixel circuits PC via the contact hole CNT. The driving voltage lines PL1_1 to PL1_7, PL2_1 to PL2_7, and PL3_1 and PL3_2 may extend in the second direction. The electrode voltage lines HL electrically connected to the driving voltage lines PL1_1 to PL1_7, PL2_1 to PL2_7, PL3_1 and PL3_2 may extend in the first direction crossing the second direction. Thus, the plurality of driving voltage lines PL1_1 to PL1_7, PL2_1 to PL2_7, PL3_1 and PL3_2 and the electrode voltage lines HL0 to HL4 may form a mesh structure in the display area DA.

In an embodiment, the power bus line 163 may be provided to prevent an IR drop of the driving voltage ELVDD around the transmission area TA. In this case, a width Wx of the transmission area TA in the first direction may be greater than a width Wy of the transmission area TA in the second direction.

For example, the width Wx of the transmission area TA in the first direction may be about 15 mm to about 20 mm, and the width Wy of the transmission area TA in the second direction may be about 1 mm to about 5 mm.

Even when the power bus line 163 is not provided, the plurality of second driving voltage lines PL2_1 to PL2_7 and the electrode voltage line HL0 may provide the mesh structure. Thus, the driving voltage ELVDD may be supplied to the pixels arranged on the upper portion of the transmission area TA to operate the pixels.

As described above with reference to FIGS. 6A and 6B, the electrode voltage lines HL0 to HL4 may be obtained by connecting the second storage capacitor plates CE2 of the storage capacitor Cst included in each pixel. Thus, the specific resistance of the electrode voltage lines HL0 to HL4 may be greater than that of the driving voltage lines PL1_1 to PL1_7. PL2_1 to PL2_7, PL3_1 and PL3_2.

If the power bus line 163 is not provided, the driving voltage ELVDD may be supplied to the second driving voltage lines PL2_1 to PL2_7 only via the electrode voltage lines HL0 having greater specific resistance. Thus, the IR drop could occur. A degree of the IR drop may be greater when the width Wx of the transmission area TA in the first direction increases.

In an embodiment, the power bus line 163 having a smaller specific resistance and arranged on the second non-display area NDA2 is connected to the plurality of second driving voltage lines PL2_1 to PL2_7. Thus, the IR drop that may occur on the disconnected driving voltage lines PL1_1 to PL1_7 and PL2_1 to PL2_7 based on the transmission area TA may be reduced.

The power bus line 163 may include a conductive material including Mo, Al, Cu, Ti, etc. and may have a single-layered or multi-layered structure. As an example, the power bus line 163 may have a multi-layered structure including Ti/Al/Ti.

In an embodiment, the power bus line 163 may be provided integrally with the plurality of second driving voltage lines PL2_1 to PL2_7. For example, the power bus line 163 may be provided at the same layer as the plurality of second driving voltage lines PL2_1 to PL2_7 by using the same material. The plurality of second driving voltage lines PL2_1 to PL2_7 may extend in the second direction from the power bus line 163 extending in the first direction.

The power bus line 163 may be connected to the plurality of third driving voltage lines PL3_1 and PL3_2 extending from the first power supply line 160. For example, the first power supply line 160 (see FIG. 4), the power bus line 163, and the third driving voltage lines PL3_1 and PL3_2 may be integrally provided with one another. In this case, the power bus line 163 may receive the driving voltage ELVDD provided from the first power supply line 160 via the plurality of third driving voltage lines PL3_1 and PL3_2, and uniform driving voltage ELVDD may be supplied to the plurality of second driving voltage lines PL2_1 to PL2_7.

A width W1 of the power bus line 163 in the second direction may be greater than a width W2 of one of the second driving voltage lines PL2_1 to PL2_7 to reduce the resistance value. For example, the width W1 of the power bus line 163 in the second direction may be about 10 um to about 30 um, and the width W2 of one of the second driving voltage lines PL2_1 to PL2_7 may be about 1 um to about 5 um.

Also, as shown in FIG. 4, the length L2 of the power bus line 163 in the first direction may be less than the length L1 of the first power supply line 160 in the first direction (L2<L1). The power bus line 163 may be connected to the disconnected second driving voltage lines PL2_1 to PL2_7 around the transmission area TA to prevent the IR drop. When the length L2 of the power bus line 163 in the first direction is reduced, the utilization of the second non-display area NDA2 may be improved.

Figure 8:
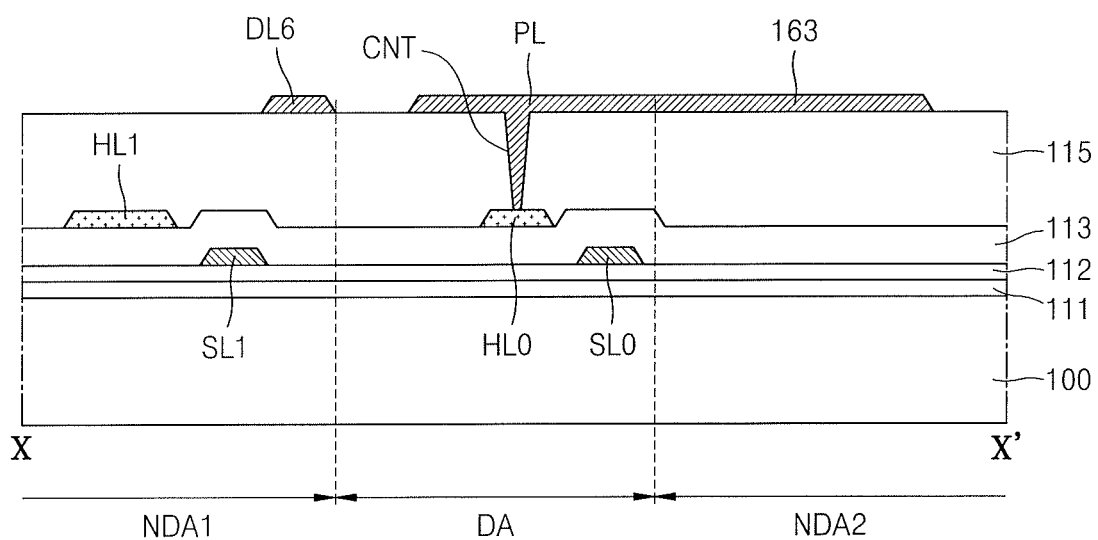
FIG. 8 illustrates a cross-sectional view taken along line X-X' of FIG. 7.

FIG. 8 illustrates a cross-sectional view taken along line X-X' of FIG. 7. In FIG. 8, like reference numerals denote the same elements as those of FIG. 6B, and detailed descriptions thereof will not be repeated.

Referring to FIG. 8, the data line DL6, the scan lines SL0 and SL1, and the electrode voltage lines HL0 and HL1 are arranged in different layers from one another, and the data line DL6, the driving voltage line PL2_7, and the power bus line 163 may be arranged at the same layer as one another.

The scan lines SL0 and SL1 may be located on the first gate insulating layer 112, and the electrode voltage lines HL0 and HL1 may be located on the second gate insulating layer 113. The data line DL6, the driving voltage line PL2_7, and the power bus line 163 may be arranged on the interlayer insulating layer 115.

Referring to FIGS. 7 and 8, the data line DL6, the scan line SL1, and the electrode voltage line HL1 arched in the first non-display area NDA1 are shown as not overlapping with one another. In some implementations, the wirings arranged in different layers in the first non-display area NDA1 may overlap one another.

Figure 9:
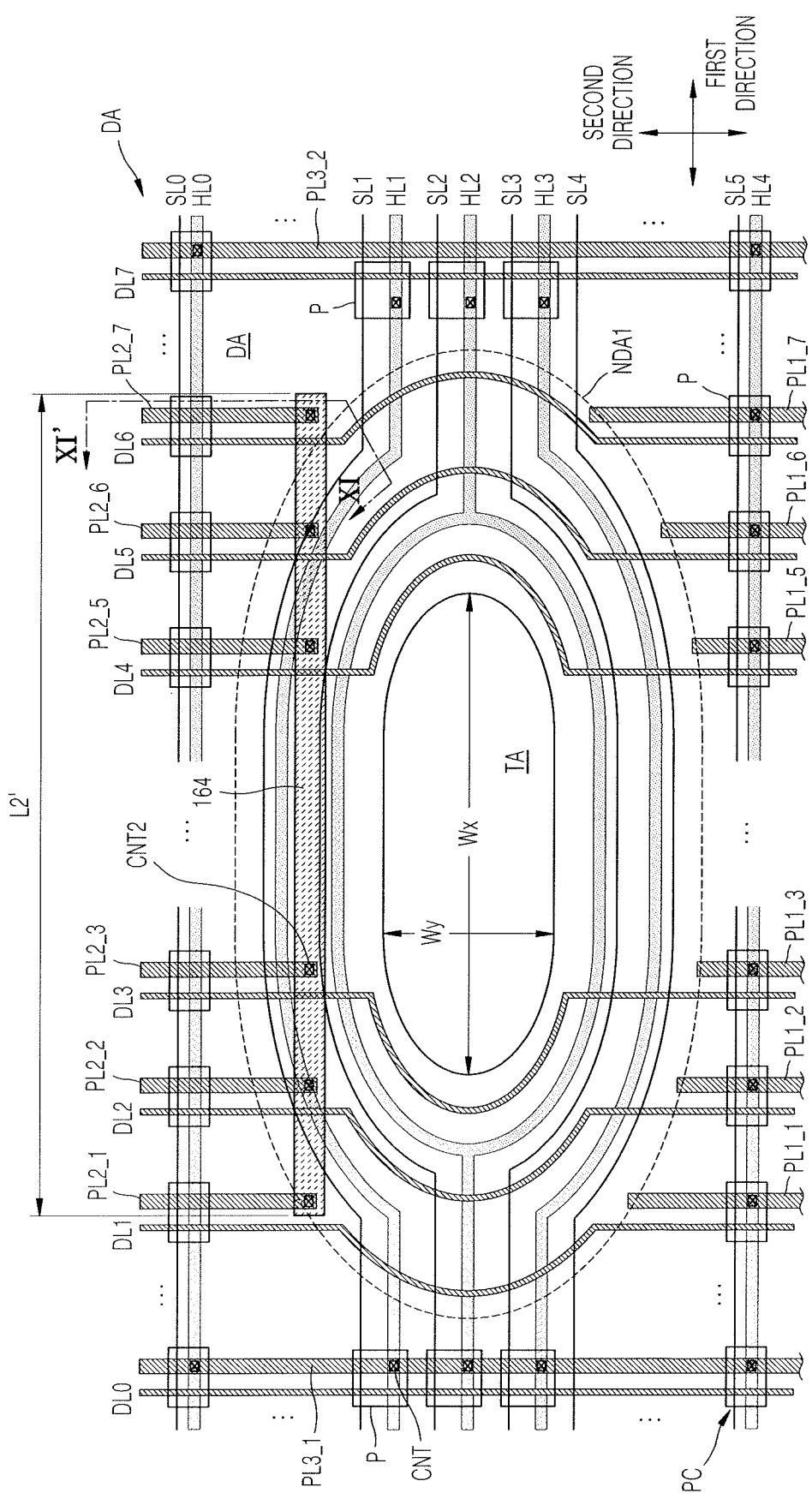
FIG. 9 illustrates a plan view of wirings around a transmission area according to an embodiment.
Figure 10:
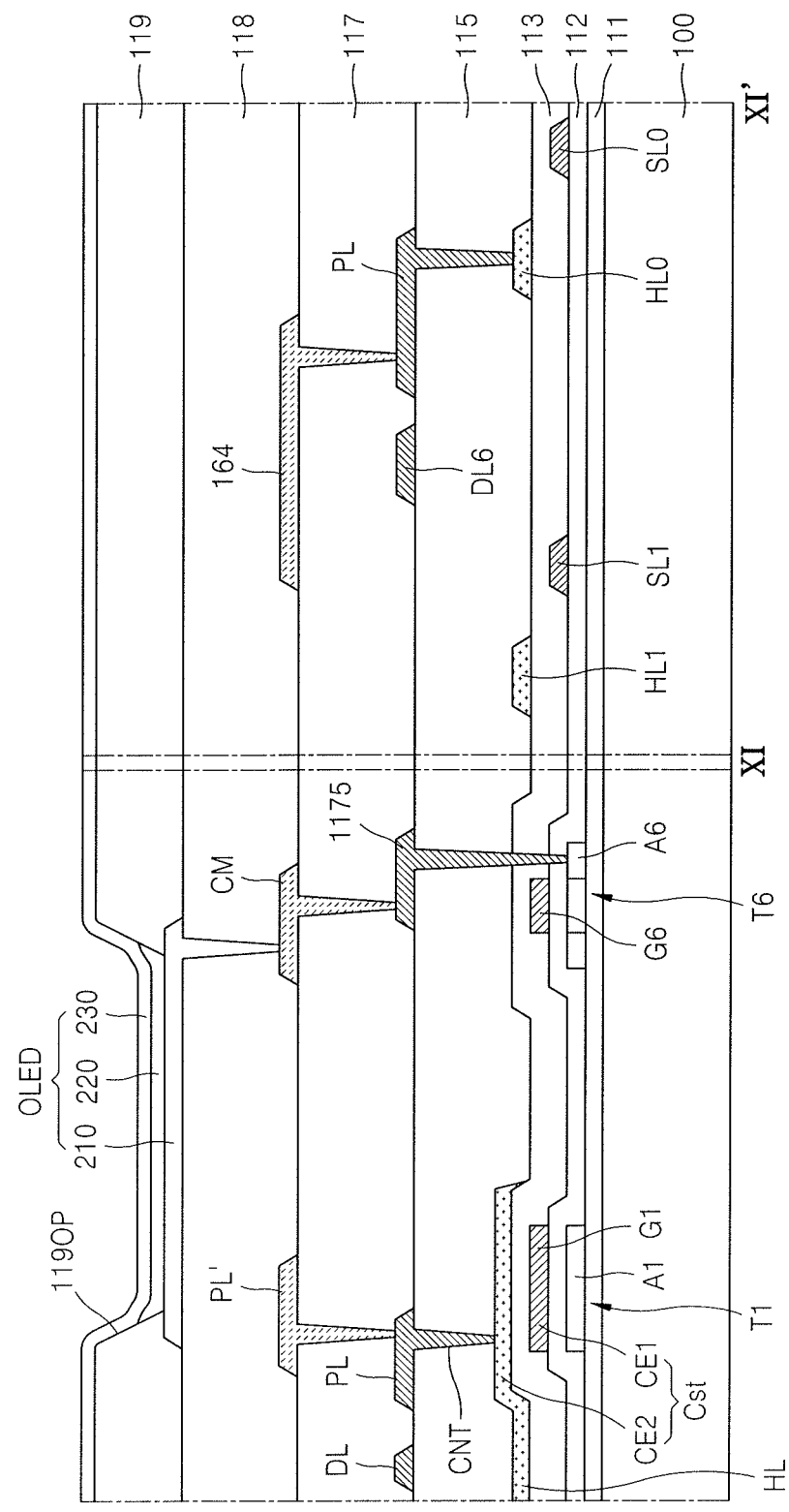
FIG. 10 illustrates a cross-sectional view taken along line XI-XI' of FIG. 9.

FIG. 9 illustrates a plan view of arrangement of the wirings around the transmission area TA of the display panel, according to an embodiment. FIG. 10 illustrates a cross-sectional view of a part of a pixel area taken along line XI-XI' of FIG. 9. In FIGS. 9 and 10, like reference numerals as those of FIGS. 6B, 7, and 8 denote the same elements, and detailed descriptions thereof are not repeated.

Referring to FIG. 9, the display panel may include the plurality of first driving voltage lines PL1_1 to PL1_7 and the plurality of second driving voltage lines PL2_1 to PL2_7 spaced apart from each other with the transmission area TA therebetween. The plurality of first driving voltage lines PL1_1 to PL1_7 and the plurality of second driving voltage lines PL2_1 to PL2_7 extend in the second direction.

The data lines DL1 to DL6 arranged around the transmission area TA may not be disconnected, but may be arranged to detour around the boundary of the transmission area TA. When the data lines DL1 to DL6 are arranged at the same layer as the driving voltage lines PL, the driving voltage lines PL may be spaced apart from one another in order to ensure a space for arching the data lines DL1 to DL6.

The plurality of first driving voltage lines PL1_1 to PL1_7 and the plurality of second driving voltage lines PL2_1 to PL2_7 may be connected to the electrode voltage lines HL0 to HL4 arranged alternately at different layers from the plurality of first driving voltage lines PL1_1 to PL1_7 and the plurality of second driving voltage lines PL2_1 to PL2_7 via a contact hole CNT1. Accordingly, the plurality of first driving voltage lines PL1_1 to PL1_7 and the plurality of second driving voltage lines PL2_1 to PL2_7 may have a mesh structure with the electrode voltage lines HL0 to HL4.

In the embodiment, a power bus line 164 connected to the plurality of second driving voltage lines PL2_1 to PL2_7 may be arranged in the first non-display area NDA1 to correspond to the upper portion of the transmission area TA.

The power bus line 164 may be arranged at a different layer from the plurality of second driving voltage lines PL2_1 to PL2_7. For example, the power bus line 164 may be on the planarization layer 117 covering the plurality of second driving voltage lines PL2_1 to PL2_7 to be connected to the plurality of second driving voltage lines PL2_1 to PL2_7 via the contact hole CNT1. When the power bus line 164 is arranged at the different layer from that of the plurality of second driving voltage lines PL2_1 to PL2_7, the power bus line 164 may be arranged to overlap the plurality of second driving voltage lines PL2_1 to PL2_7 and the data lines DL2 to DL6.

In addition, the power bus line 164 may overlap the scan lines SL1 and SL2 arching around the edge of the transmission area TA.

The power bus line 164 may extend in the first direction. In some embodiments, a length L2 of the power bus line 164 in the first direction may be less than the length L1 of the first power supply line 160 in the first direction, as described above with reference to FIG. 4. In some implementations, the number of driving voltage lines PL connected to the power bus line 164 may be less than that of the driving voltage lines PL connected to the first power supply line 160. In some embodiments, the length L2' of the power bus line 164 in the first direction may be equal to or greater than the width Wx of the transmission area TA in the first direction.

In addition, the specific resistance of the power bus line 164 may be less than that of the electrode voltage lines HL0 to HL4. Accordingly, the IR drop that may occur in the second driving voltage lines PL2_1 to PL2_7 may be reduced.

Referring to FIG. 10, the display panel according to the embodiment may further include an upper planarization layer 118 on the planarization layer 117. An additional wiring PL', an intermediate wiring CM, and the power bus line 164 may be arranged on the planarization layer 117.

The upper planarization layer 118 may include an organic material and/or an inorganic material. For example, the organic material may include a general universal polymer (BCB, polyimide, HMDSO, PMMA, or PS), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. The inorganic material may include an insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The upper planarization layer 118 may include a single-layered or multi-layered structure.

The additional wiring PL' arranged on the planarization layer 117 may function as a driving voltage line transferring the driving voltage or a data line transferring a data signal. The additional wiring PL' may be connected to the data line DL or the driving voltage line PL via a contact hole defined in the planarization layer 117. Also, the pixel electrode 210 of the organic light-emitting diode OLED may be connected to the emission control TFT T6 via the intermediate wiring CM on the planarization layer 117. The pixel electrode 210 may be located on the upper planarization layer 118 and may be connected to the intermediate wiring CM via the contact hole defined in the upper planarization layer 118.

The power bus line 164 may be located on the planarization layer 117 and may be connected to the second driving voltage line PL2_7 via a contact hole CNT1 defined in the planarization layer 117.

The power bus line 164, the additional wiring PL', and the intermediate wiring CM may each include Mo, Al, Cu, Ti, etc., and may have a single-layered or multi-layered structure. As an example, the power bus line 164 may have a multi-layered structure including Ti/Al/Ti. The specific resistance of the power bus line 164 may be less than that of the electrode voltage lines HL0 to HL4. Accordingly, the uniform driving voltage ELVDD may be transferred to the plurality of second driving voltage lines PL2_1 to PL2_7, and the IR drop may be reduced.

In FIG. 9, the power bus line 164 is shown as being connected only to the plurality of second driving voltage lines PL2_1 to PL2_7. In some implementations, the power bus line 164 may be connected to at least one of the plurality of third driving voltage lines PL3_1 and PL3_2 extending from the first power supply line 160 (see FIG. 4).

Figure 11:
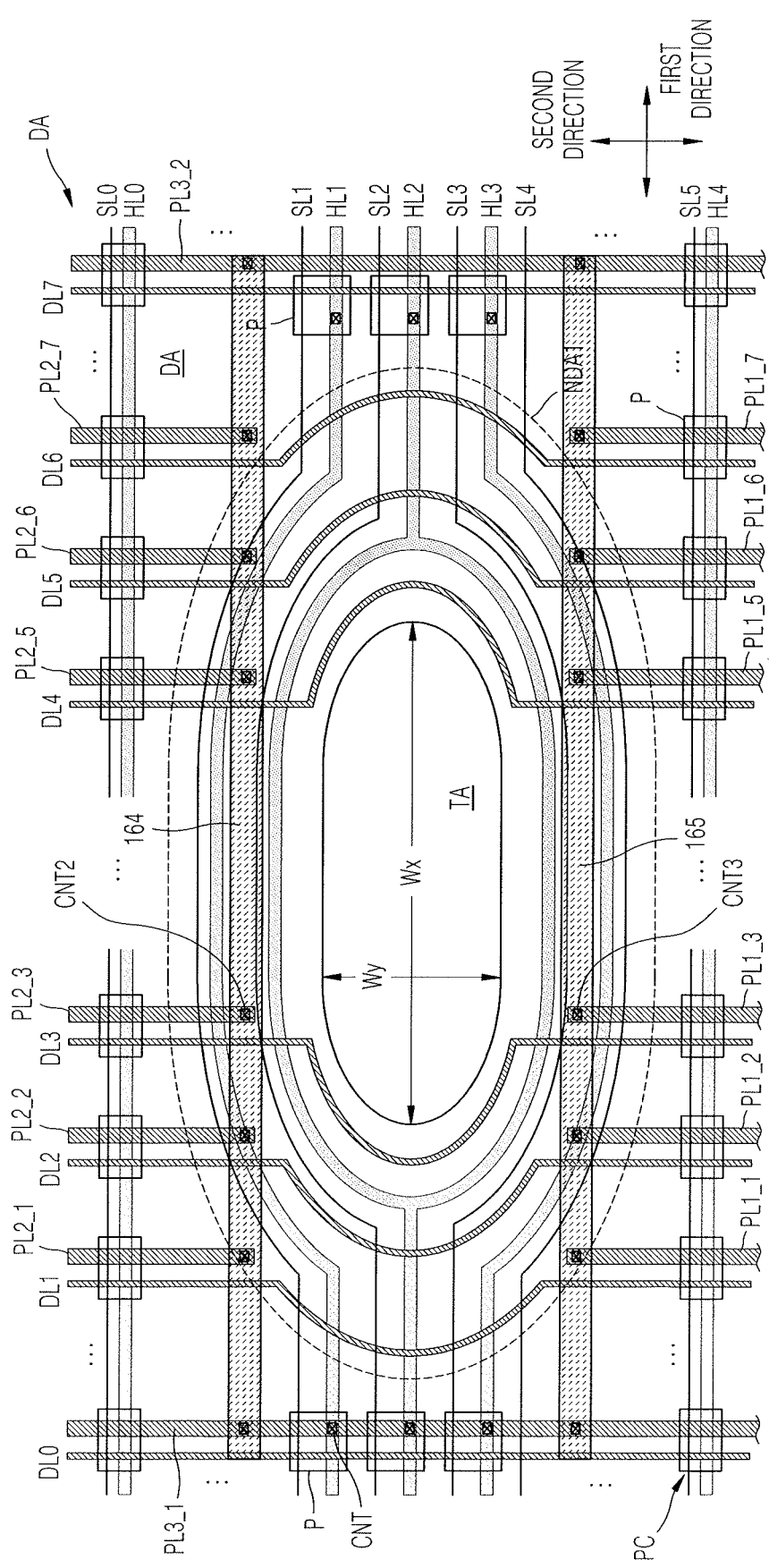
FIG. 11 illustrates a plan view of wirings around a transmission area according to an embodiment.

FIG. 11 illustrates a plan view of an arrangement of the wirings around the transmission area TA of the display panel, according to an embodiment. In FIG. 11, like reference numerals denote the same elements as those of FIG. 9, and detailed descriptions thereof are not repeated.

Referring to FIG. 11, the display panel according to the embodiment includes a plurality of first driving voltage lines PL1_1 and PL1_2 extending in the second direction from the first power supply line 160, and a plurality of second driving voltage lines PL2_1 to PL2_7 spaced apart from the plurality of first driving voltage lines PL1_1 and PL1_2 with the transmission area TA therebetween.

The data lines DL1 to DL6 arranged around the transmission area TA may not be disconnected, but may be arranged to detour around a boundary of the transmission area TA. When the data lines DL1 to DL6 are arranged at the same layer as that of the driving voltage lines PL, the driving voltage lines PL may be spaced apart from one another in order to ensure a space for arching the data lines DL1 to DL6.

The plurality of first driving voltage lines PL1_1 to PL1_7 and the plurality of second driving voltage lines PL2_1 to PL2_7 may be connected to the electrode voltage lines HL0 to HL4 arranged alternately at different layers from the plurality of first driving voltage lines PL1_1 to PL1_7 and the plurality of second driving voltage lines PL2_1 to PL2_7 via a contact hole CNT1. Accordingly, the plurality of first driving voltage lines PL1_1 to PL1_7 and the plurality of second driving voltage lines PL2_1 to PL2_7 may have a mesh structure with the electrode voltage lines HL0 to HL4.

In the display panel according to the embodiment, the power bus line 164 may be arranged on the transmission area TA, and an additional power bus line 165 may be arranged on a lower portion of the transmission area TA.

The power bus line 164 may be arranged in the first non-display area NDA1 to correspond to the upper portion of the transmission area TA. The power bus line 164 may extend in the first direction. In some embodiments, the length L2' of the power bus line 164 in the first direction may be equal to or greater than the width Wx of the transmission area TA in the first direction.

The power bus line 164 may be arranged with the planarization layer 117 (see FIG. 10) provided between the power bus line 164 and the plurality of second driving voltage lines PL2_1 to PL2_7. The power bus line 164 may be connected to end portions of the plurality of second driving voltage lines PL2_1 to PL2_7 via the contact hole CNT1. In some embodiments, the power bus line 164 may be connected to at least one of the plurality of third driving voltage lines PL3_1 and PL3_2 via a contact hole CNT2.

The additional power bus line 165 may be arranged in the first non-display area NDA1 to correspond to the lower portion of the transmission area TA. The additional power bus line 165 may extend in the first direction. In some embodiments, a length L3 of the additional power bus line 165 in the first direction may be equal to or greater than the width Wx of the transmission area TA in the first direction. The additional power bus line 165 may be arranged with the planarization layer 117 (see FIG. 10) provided between the power bus line 164 and the plurality of first driving voltage lines PL1_1 to PL1_7. The additional power bus line 165 may be connected to end portions of the plurality of first driving voltage lines PL1_1 to PL1_7 via the contact hole CNT2. In some embodiments, the additional power bus line 165 may be connected to at least one of the plurality of third driving voltage lines PL3_1 and PL3_2 via the contact hole CNT2.

The power bus line 164 and the additional power bus line 165 may each include Mo, Al, Cu, Ti, etc., and may have a single-layered or multi-layered structure. As an example, the power bus line 164 and the additional power bus line 165 may each have a multi-layered structure including Ti/Al/Ti.

A specific resistance of the power bus line 164 and the additional power bus line 165 may be less than that of the electrode voltage lines HL0 to HL4. Accordingly, the constant driving voltage ELVDD may be transferred to the plurality of first driving voltage lines PL1_1 to PL1_7, the plurality of second driving voltage lines PL2_1 to PL2_7, and the plurality of third driving voltage lines PL3_1 and PL3_2 arranged around the transmission area TA, and the IR drop may be reduced.

Figure 12:
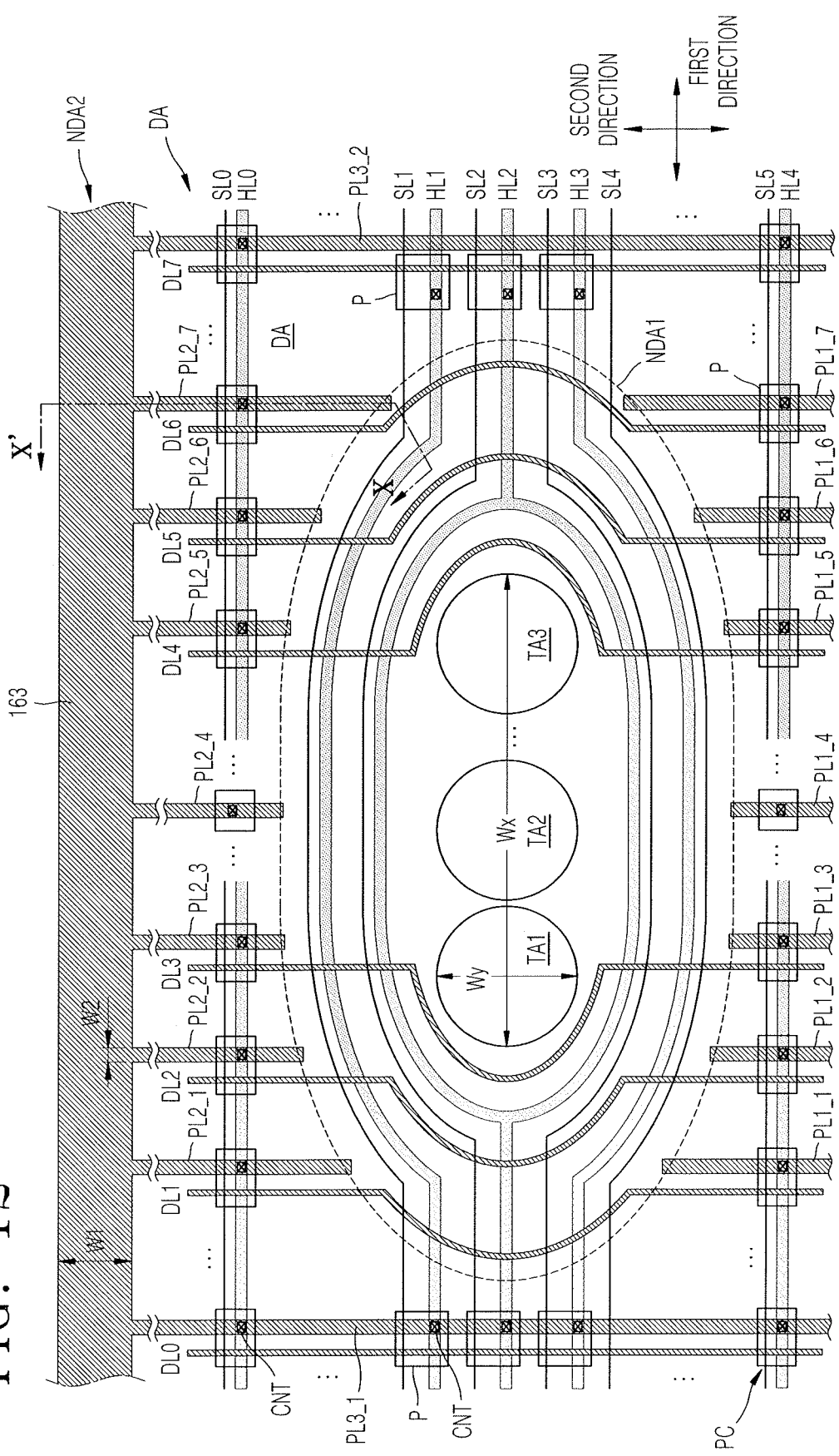
FIG. 12 illustrates a plan view of wirings around a transmission area according to an embodiment.

FIG. 12 illustrates a plan view of n arrangement of the wirings around the transmission area TA of the display panel, according to an embodiment. In FIG. 12, like reference numerals denote the same elements as those of FIG. 7, and detailed descriptions thereof are not repeated.

Referring to FIG. 12, the display panel may include the plurality of first driving voltage lines PL1_1 to PL1_7 and the plurality of second driving voltage lines PL2_1 to PL2_7 spaced apart from each other with the transmission area TA therebetween. The plurality of first driving voltage lines PL1_1 to PL1_7 and the plurality of second driving voltage lines PL2_1 to PL2_7 may extend in the second direction.

The plurality of first driving voltage lines PL1_1 to PL1_7 and the plurality of second driving voltage lines PL2_1 to PL2_7 may be connected to the electrode voltage lines HL0 to HL4 arranged alternately at different layers from the plurality of first driving voltage lines PL1_1 to PL1_7 and the plurality of second driving voltage lines PL2_1 to PL2_7 via a contact hole CNT1. Accordingly, the plurality of first driving voltage lines PL1_1 to PL1_7 and the plurality of second driving voltage lines PL2_1 to PL2_7 may have a mesh structure with the electrode voltage lines HL0 to HL4.

The data lines DL1 to DL6 arranged around the transmission area TA may not be disconnected, but may be arranged to detour around a boundary of the transmission area TA. When the data lines DL1 to DL6 are arranged at the same layer as that of the driving voltage lines PL, the driving voltage lines PL may be spaced apart from one another in order to ensure a space for arching the data lines DL1 to DL6.

The plurality of second driving voltage lines PL2_1 to PL2_7 may be arranged in the second non-display area NDA2 and may be connected to the power bus line 163 extending in the first direction. When the specific resistance of the power bus line 163 is less than that of the electrode voltage lines HL0 to HL4, the IR drop that could occur in the second driving voltage lines PL2_1 to PL2_7 may be reduced.

In the embodiment, there may be a plurality of transmission areas TA1, TA2, and TA3. The first non-display area NDA1 may be arranged to surround the plurality of transmission areas TA1, TA2, and TA3. A component for sensing light or sound may be arranged in each of the plurality of transmission areas TA1, TA2, and TA3. In FIG. 12, three transmission areas TA1, TA2, and TA3 are shown. In some implementations, there may be one or two transmission areas or more than three transmission areas.

In addition, when the plurality of transmission areas TA, TA2, and TA3 are surrounded by the first non-display area NDA1, the width Wx of the plurality of transmission areas TA1, TA2, and TA3 in the first direction may be recognized as a length of a line connecting a rightmost point to a leftmost point of the plurality of transmission areas TA1, TA2, and TA3.

In the embodiment, the power bus line 163 may be provided to prevent IR drop of the driving voltage ELVDD around the plurality of transmission areas TA1, TA2, and TA3. A width Wx of the transmission area TA in the first direction may be greater than a width Wy of the transmission area TA in the second direction. In the embodiment, the width Wx of the plurality of transmission areas TA1, TA2, and TA3 in the first direction may be about 15 mm to about 20 mm.

According to some embodiments, an IR drop that may occur in the wirings around the transmission area corresponding to electronic elements such as a sensor, a camera, etc. may be reduced. Thus, a display quality may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display panel, comprising:
a substrate including a first non-display area surrounding a transmission area, a display area on an outer portion of the first non-display area, and a second non-display area surrounding the display area;
driving thin film transistors and display elements in the display area;
a first power supply line in the second non-display area, the first power supply line extending in a first direction;
a plurality of first driving voltage lines and a plurality of second driving voltage lines extending in a second direction intersecting with the first direction and spaced apart from each other with the transmission area therebetween; and
a power bus line connected to the plurality of second driving voltage lines in the first non-display area or the second non-display area, the power bus line extending in the first direction,
wherein a length of the power bus line in the first direction is less than a length of the first power supply line in the first direction.

2. The display panel as claimed in claim 1, wherein the power bus line is in the second non-display area and is integrated with the plurality of second driving voltage lines.

3. The display panel as claimed in claim 1, further comprising at least one third driving voltage line extending from the first power supply line in the second direction and connected to the power bus line,
wherein the at least one third driving voltage line, the first power supply line, and the power bus line are integrated with one another.

4. The display panel as claimed in claim 1, further comprising at least one fourth driving voltage line extending from the first power supply line in the second direction,
wherein an end of the at least one fourth driving voltage line is spaced apart from the power bus line.

5. The display panel as claimed in claim 1, further comprising a plurality of electrode voltage lines arranged at a different layer from the plurality of first driving voltage lines and the plurality of second driving voltage lines, the plurality of electrode voltage lines extending in the first direction, and intersecting the plurality of first driving voltage lines and the plurality of second driving voltage lines,
wherein the plurality of electrode voltage lines are connected to the plurality of first driving voltage lines and the plurality of second driving voltage lines via a contact hole.

6. The display panel as claimed in claim 5, wherein a specific resistance of the power bus line is less than a specific resistance of the plurality of electrode voltage lines.

7. The display panel as claimed in claim 5, wherein at least some of the plurality of electrode voltage lines are connected to one another in a ring shape around the transmission area.

8. The display panel as claimed in claim 5, wherein each of the driving thin film transistors includes a semiconductor layer and a driving gate electrode, and
the plurality of electrode voltage lines overlap the driving gate electrode to form a storage capacitor.

9. The display panel as claimed in claim 1, wherein a width of the transmission area in the first direction is greater than a width of the transmission area in the second direction.

10. The display panel as claimed in claim 1, wherein the power bus line is in the first non-display area at a different layer from the plurality of second driving voltage lines and is connected to the plurality of second driving voltage lines via a contact hole.

11. The display panel as claimed in claim 10, further comprising a plurality of scan lines extending in the first direction and arched around a boundary of the transmission area,
wherein the power bus line overlaps arched parts in the plurality of scan lines.

12. The display panel as claimed in claim 1, further comprising an additional power bus line connected to the plurality of first driving voltage lines and extending in the first direction,
wherein the additional power bus line is arranged in the first non-display area.

13. The display panel as claimed in claim 1, wherein:
the transmission area includes a plurality of transmission areas, and
the first non-display area surrounds the plurality of transmission areas.

14. A display panel comprising:
a substrate including a first non-display area surrounding a transmission area, a display area on an outer portion of the first non-display area, and a second non-display area surrounding the display area;
driving thin film transistors and display elements in the display area;
a first power supply line in the second non-display area, the first power supply line extending in a first direction;
a plurality of first driving voltage lines and a plurality of second driving voltage lines extending in a second direction intersecting the first direction and spaced apart from each other with the transmission area therebetween;
a power bus line connected to the plurality of second driving voltage lines, the power bus line being in the first non-display area or the second non-display area to extend in the first direction; and
a plurality of electrode voltage lines intersecting the plurality of first driving voltage lines and the plurality of second driving voltage lines at a different layer from the plurality of first driving voltage lines and the plurality of second driving voltage lines, the plurality of electrode voltage lines being connected to the plurality of first driving voltage lines and the plurality of second driving voltage lines via a contact hole.

15. The display panel as claimed in claim 14, wherein a specific resistance of the power bus line is less than a specific resistance of the plurality of electrode voltage lines.

16. The display panel as claimed in claim 14, wherein at least some of the plurality of electrode voltage lines are connected to one another in a ring shape around the transmission area.

17. The display panel as claimed in claim 14, wherein each of the driving thin film transistors includes a semiconductor layer and a driving gate electrode, and
the plurality of electrode voltage lines overlap the driving gate electrode to form a storage capacitor.

18. The display panel as claimed in claim 14, wherein the power bus line is in the second non-display area and is integrated with the plurality of second driving voltage lines.

19. The display panel as claimed in claim 14, wherein the power bus line is in the first non-display area and is located at a different layer from the plurality of second driving voltage lines to be connected to the plurality of second driving voltage lines via a contact hole.

20. The display panel as claimed in claim 14, further comprising an additional power bus line connected to the plurality of first driving voltage lines and extending in the first direction, wherein the additional power bus line is in the first non-display area.

* * * * *